US008762675B2

(12) United States Patent
Wang et al.

(10) Patent No.: US 8,762,675 B2
(45) Date of Patent: *Jun. 24, 2014

(54) MEMORY SYSTEM FOR SYNCHRONOUS DATA TRANSMISSION

(75) Inventors: David T. Wang, Thousand Oaks, CA (US); Suresh Natarajan Rajan, San Jose, CA (US)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/620,199

(22) Filed: Sep. 14, 2012

(65) Prior Publication Data

US 2013/0124904 A1    May 16, 2013

Related U.S. Application Data

(63) Continuation of application No. 12/144,396, filed on Jun. 23, 2008, now Pat. No. 8,386,722.

(51) Int. Cl.
*G06F 13/28*    (2006.01)
*G06F 13/16*    (2006.01)
*G11C 7/22*     (2006.01)

(52) U.S. Cl.
CPC .............. *G06F 13/1689* (2013.01); *G11C 7/22* (2013.01)
USPC .......................................... 711/167; 711/154

(58) Field of Classification Search
None
See application file for complete search history.

(56) References Cited

U.S. PATENT DOCUMENTS

| 3,800,292 A | 3/1974 | Curley et al. |
| 4,069,452 A | 1/1978 | Conway et al. |
| 4,323,965 A | 4/1982 | Johnson et al. |
| 4,334,307 A | 6/1982 | Bourgeois et al. |
| 4,345,319 A | 8/1982 | Bernardini et al. |
| 4,392,212 A | 7/1983 | Miyasaka et al. ............. 365/230 |
| 4,500,958 A | 2/1985 | Manton et al. |
| 4,525,921 A | 7/1985 | Carson et al. |
| 4,566,082 A | 1/1986 | Anderson |
| 4,592,019 A | 5/1986 | Huang et al. .................... 365/78 |
| 4,628,407 A | 12/1986 | August et al. |

(Continued)

FOREIGN PATENT DOCUMENTS

| DE | 102004051345 | 5/2006 | ............. G11C 29/12 |
| DE | 102004053316 | 5/2006 | |

(Continued)

OTHER PUBLICATIONS

Kellerbauer "Die Schnelle Million," with translation, "The quick million."

(Continued)

*Primary Examiner* — Than Nguyen
(74) *Attorney, Agent, or Firm* — Fish & Richardson P.C.

(57) ABSTRACT

One embodiment of the present invention sets forth an interface circuit configured to combine time staggered data bursts returned by multiple memory devices into a larger contiguous data burst. As a result, an accurate timing reference for data transmission that retains the use of data (DQ) and data strobe (DQS) signals in an infrastructure-compatible system while eliminating the cost of the idle cycles required for data bus turnarounds to switch from reading from one memory device to reading from another memory device, or from writing to one memory device to writing to another memory device may be obtained, thereby increasing memory system bandwidth relative to the prior art approaches.

16 Claims, 13 Drawing Sheets

(56) References Cited

U.S. PATENT DOCUMENTS

| | | |
|---|---|---|
| 4,646,128 A | 2/1987 | Carson et al. |
| 4,698,748 A | 10/1987 | Juzswik et al. ............... 364/200 |
| 4,706,166 A | 11/1987 | Go |
| 4,710,903 A | 12/1987 | Hereth et al. ................. 365/194 |
| 4,764,846 A | 8/1988 | Go |
| 4,780,843 A | 10/1988 | Tietjen ........................ 364/900 |
| 4,794,597 A | 12/1988 | Ooba et al. |
| 4,796,232 A | 1/1989 | House ............................ 365/189 |
| 4,807,191 A | 2/1989 | Flannagan |
| 4,841,440 A | 6/1989 | Yonezu et al. ................ 364/200 |
| 4,862,347 A | 8/1989 | Rudy |
| 4,884,237 A | 11/1989 | Mueller et al. |
| 4,887,240 A | 12/1989 | Garverick et al. ............. 361/222 |
| 4,888,687 A | 12/1989 | Allison et al. |
| 4,899,107 A | 2/1990 | Corbett et al. ................. 324/158 |
| 4,912,678 A | 3/1990 | Mashiko |
| 4,916,575 A | 4/1990 | Van Asten |
| 4,922,451 A | 5/1990 | Lo et al. |
| 4,935,734 A | 6/1990 | Austin ...................... 340/825.83 |
| 4,937,791 A | 6/1990 | Steele et al. |
| 4,956,694 A | 9/1990 | Eide |
| 4,982,265 A | 1/1991 | Watanabe et al. |
| 4,983,533 A | 1/1991 | Go |
| 5,025,364 A | 6/1991 | Zellmer |
| 5,072,424 A | 12/1991 | Brent et al. ................... 365/189 |
| 5,083,266 A | 1/1992 | Watanabe ..................... 395/275 |
| 5,104,820 A | 4/1992 | Go et al. |
| 5,193,072 A | 3/1993 | Frenkil et al. |
| 5,212,666 A | 5/1993 | Takeda |
| 5,220,672 A | 6/1993 | Nakao et al. .................. 395/750 |
| 5,222,014 A | 6/1993 | Lin |
| 5,241,266 A | 8/1993 | Ahmad et al. ................. 324/158 |
| 5,252,807 A | 10/1993 | Chizinsky .................... 219/390 |
| 5,257,233 A | 10/1993 | Schaefer ...................... 365/227 |
| 5,278,796 A | 1/1994 | Tillinghast et al. ............ 365/211 |
| 5,282,177 A | 1/1994 | McLaury ..................... 365/230 |
| 5,332,922 A | 7/1994 | Oguchi et al. ................. 257/723 |
| 5,347,428 A | 9/1994 | Carson et al. |
| 5,369,749 A | 11/1994 | Baker et al. |
| 5,384,745 A | 1/1995 | Konishi et al. ........... 365/230.03 |
| 5,388,265 A | 2/1995 | Volk ............................. 395/750 |
| 5,390,078 A | 2/1995 | Taylor |
| 5,390,334 A | 2/1995 | Harrison |
| 5,392,251 A | 2/1995 | Manning |
| 5,408,190 A | 4/1995 | Wood et al. ................... 324/765 |
| 5,432,729 A | 7/1995 | Carson et al. |
| 5,448,511 A | 9/1995 | Paurus et al. |
| 5,453,434 A | 9/1995 | Albaugh et al. .............. 514/397 |
| 5,467,455 A | 11/1995 | Gay et al. ...................... 395/281 |
| 5,483,497 A | 1/1996 | Mochizuki et al. |
| 5,498,886 A | 3/1996 | Hsu et al. ...................... 257/213 |
| 5,502,333 A | 3/1996 | Bertin et al. |
| 5,502,667 A | 3/1996 | Bertin et al. |
| 5,513,135 A | 4/1996 | Dell et al. |
| 5,513,339 A | 4/1996 | Agrawal et al. |
| 5,519,832 A | 5/1996 | Warchol |
| 5,526,320 A | 6/1996 | Zagar et al. ................... 365/233 |
| 5,530,836 A | 6/1996 | Busch et al. .................. 395/477 |
| 5,550,781 A | 8/1996 | Sugawara et al. |
| 5,559,990 A | 9/1996 | Cheng et al. .................. 395/484 |
| 5,561,622 A | 10/1996 | Bertin et al. |
| 5,563,086 A | 10/1996 | Bertin et al. |
| 5,566,344 A | 10/1996 | Hall et al. ..................... 395/800 |
| 5,581,498 A | 12/1996 | Ludwig et al. |
| 5,581,779 A | 12/1996 | Hall et al. ..................... 395/800 |
| 5,590,071 A | 12/1996 | Kolor et al. ................... 365/149 |
| 5,598,376 A | 1/1997 | Merritt et al. ................. 365/230 |
| 5,604,714 A | 2/1997 | Manning et al. .............. 365/230 |
| 5,606,710 A | 2/1997 | Hall et al. ..................... 395/800 |
| 5,608,262 A | 3/1997 | Degani et al. |
| 5,610,864 A | 3/1997 | Manning ...................... 365/193 |
| 5,623,686 A | 4/1997 | Hall et al. ..................... 395/800 |
| 5,627,791 A | 5/1997 | Wright et al. ................. 365/222 |
| 5,640,337 A | 6/1997 | Huang et al. .................. 364/578 |
| 5,640,364 A | 6/1997 | Merritt et al. ................. 365/233 |
| 5,652,724 A | 7/1997 | Manning ....................... 365/189 |
| 5,654,204 A | 8/1997 | Anderson ...................... 438/15 |
| 5,661,677 A | 8/1997 | Rondeau et al. ................ 365/63 |
| 5,661,695 A | 8/1997 | Zagar et al. ................... 365/233 |
| 5,668,773 A | 9/1997 | Zagar et al. ................... 365/233 |
| 5,675,549 A | 10/1997 | Ong et al. ..................... 365/233 |
| 5,680,342 A | 10/1997 | Frankeny |
| 5,682,354 A | 10/1997 | Manning ...................... 365/233 |
| 5,692,121 A | 11/1997 | Bozso et al. |
| 5,692,202 A | 11/1997 | Kardach et al. ............... 395/750 |
| 5,696,732 A | 12/1997 | Zagar et al. ................... 365/233 |
| 5,696,929 A | 12/1997 | Hasbun et al. |
| 5,702,984 A | 12/1997 | Bertin et al. |
| 5,703,813 A | 12/1997 | Manning et al. .............. 365/189 |
| 5,706,247 A | 1/1998 | Merritt et al. ................. 365/233 |
| RE35,733 E | 2/1998 | Hernandez et al. |
| 5,717,654 A | 2/1998 | Manning ...................... 365/233 |
| 5,721,859 A | 2/1998 | Manning ...................... 397/421 |
| 5,724,288 A | 3/1998 | Cloud et al. .................. 365/193 |
| 5,729,503 A | 3/1998 | Manning ...................... 365/233 |
| 5,729,504 A | 3/1998 | Cowles ......................... 365/236 |
| 5,742,792 A | 4/1998 | Yanai et al. |
| 5,748,914 A | 5/1998 | Barth et al. .................... 395/285 |
| 5,752,045 A | 5/1998 | Chen ............................. 395/750 |
| 5,757,703 A | 5/1998 | Merritt et al. ................. 365/189 |
| 5,760,478 A | 6/1998 | Bozso et al. |
| 5,761,703 A | 6/1998 | Bolyn ............................ 711/106 |
| 5,765,203 A | 6/1998 | Sangha |
| 5,781,766 A | 7/1998 | Davis ............................ 395/552 |
| 5,787,457 A | 7/1998 | Miller et al. |
| 5,798,961 A | 8/1998 | Heyden et al. .................. 365/52 |
| 5,802,010 A | 9/1998 | Zagar et al. ................... 365/233 |
| 5,802,395 A | 9/1998 | Connolly et al. |
| 5,802,555 A | 9/1998 | Shigeeda ...................... 711/106 |
| 5,812,488 A | 9/1998 | Zagar et al. ................... 365/233 |
| 5,818,788 A | 10/1998 | Kimura et al. |
| 5,819,065 A | 10/1998 | Chilton et al. |
| 5,831,833 A | 11/1998 | Shirakawa et al. |
| 5,831,931 A | 11/1998 | Manning ...................... 365/233 |
| 5,831,932 A | 11/1998 | Merritt et al. ................. 365/233 |
| 5,834,838 A | 11/1998 | Anderson .................... 257/697 |
| 5,835,435 A | 11/1998 | Bogin et al. .................... 365/22 |
| 5,838,165 A | 11/1998 | Chatter |
| 5,838,177 A | 11/1998 | Keeth ............................ 327/108 |
| 5,841,580 A | 11/1998 | Farmwald et al. ............. 365/194 |
| 5,843,799 A | 12/1998 | Hsu et al. .......................... 438/6 |
| 5,843,807 A | 12/1998 | Burns |
| 5,845,108 A | 12/1998 | Yoo et al. ...................... 395/551 |
| 5,850,368 A | 12/1998 | Ong et al. ..................... 365/238 |
| 5,859,792 A | 1/1999 | Rondeau et al. ................ 365/52 |
| 5,860,106 A | 1/1999 | Domen et al. ................. 711/137 |
| 5,870,347 A | 2/1999 | Keeth et al. ................... 365/230 |
| 5,870,350 A | 2/1999 | Bertin et al. |
| 5,872,907 A | 2/1999 | Griess et al. |
| 5,875,142 A | 2/1999 | Chevallier .................... 365/212 |
| 5,878,279 A | 3/1999 | Athenes |
| 5,884,088 A | 3/1999 | Kardach et al. .......... 395/750.06 |
| 5,901,105 A | 5/1999 | Ong et al. ................ 365/230.06 |
| 5,903,500 A | 5/1999 | Tsang et al. .............. 365/189.05 |
| 5,905,688 A | 5/1999 | Park ............................. 365/227 |
| 5,907,512 A | 5/1999 | Parkinson et al. ............. 365/195 |
| 5,910,010 A | 6/1999 | Nishizawa et al. |
| 5,913,072 A | 6/1999 | Wieringa |
| 5,915,105 A | 6/1999 | Farmwald et al. ............. 395/309 |
| 5,915,167 A | 6/1999 | Leedy |
| 5,917,758 A | 6/1999 | Keeth ...................... 365/189.05 |
| 5,923,611 A | 7/1999 | Ryan ............................ 365/233 |
| 5,924,111 A | 7/1999 | Huang et al. |
| 5,926,435 A | 7/1999 | Park et al. |
| 5,929,650 A | 7/1999 | Pappert et al. ................ 324/763 |
| 5,943,254 A | 8/1999 | Bakeman, Jr. et al. |
| 5,946,265 A | 8/1999 | Cowles ......................... 365/233 |
| 5,949,254 A | 9/1999 | Keeth .............................. 326/87 |
| 5,953,215 A | 9/1999 | Karabatsos |
| 5,953,263 A | 9/1999 | Farmwald et al. ............. 365/194 |
| 5,954,804 A | 9/1999 | Farmwald et al. ............... 710/36 |
| 5,956,233 A | 9/1999 | Yew et al. |
| 5,960,468 A | 9/1999 | Paluch |
| 5,962,435 A | 10/1999 | Mao et al. ...................... 514/63 |

(56) References Cited

U.S. PATENT DOCUMENTS

| | | | |
|---|---|---|---|
| 5,963,429 A | 10/1999 | Chen | |
| 5,963,463 A | 10/1999 | Rondeau et al. | 365/52 |
| 5,963,464 A | 10/1999 | Dell et al. | |
| 5,963,504 A | 10/1999 | Manning | 365/233 |
| 5,966,724 A | 10/1999 | Ryan | 711/105 |
| 5,966,727 A | 10/1999 | Nishino | 711/127 |
| 5,969,996 A | 10/1999 | Muranaka et al. | 365/189.01 |
| 5,973,392 A | 10/1999 | Senba et al. | |
| 5,978,304 A | 11/1999 | Crafts | |
| 5,995,424 A | 11/1999 | Lawrence et al. | |
| 5,995,443 A | 11/1999 | Farmwald et al. | 365/233 |
| 6,001,671 A | 12/1999 | Fjelstad | |
| 6,002,613 A | 12/1999 | Cloud et al. | 365/189 |
| 6,002,627 A | 12/1999 | Chevallier | 365/212 |
| 6,014,339 A | 1/2000 | Kobayashi et al. | 365/233 |
| 6,016,282 A | 1/2000 | Keeth | 365/233 |
| 6,026,027 A | 2/2000 | Terrell, II et al. | |
| 6,026,050 A | 2/2000 | Baker et al. | 365/233 |
| 6,029,250 A | 2/2000 | Keeth | 713/400 |
| 6,032,214 A | 2/2000 | Farmwald et al. | 710/129 |
| 6,032,215 A | 2/2000 | Farmwald et al. | 710/129 |
| 6,034,916 A | 3/2000 | Lee | 365/233 |
| 6,034,918 A | 3/2000 | Farmwald et al. | 365/233 |
| 6,035,365 A | 3/2000 | Farmwald et al. | 710/129 |
| 6,038,195 A | 3/2000 | Farmwald et al. | 365/233 |
| 6,038,673 A | 3/2000 | Benn et al. | 713/323 |
| 6,044,028 A | 3/2000 | Kumagai et al. | |
| 6,044,032 A | 3/2000 | Li | 365/230 |
| 6,047,073 A | 4/2000 | Norris et al. | |
| 6,047,344 A | 4/2000 | Kawasumi et al. | 710/107 |
| 6,047,361 A | 4/2000 | Ingenio et al. | |
| 6,053,948 A | 4/2000 | Vaidyanathan et al. | 703/14 |
| 6,058,451 A | 5/2000 | Bermingham et al. | |
| 6,065,092 A | 5/2000 | Roy | |
| 6,069,504 A | 5/2000 | Keeth | 327/108 |
| 6,070,217 A | 5/2000 | Connolly et al. | |
| 6,073,223 A | 6/2000 | McAllister et al. | 711/167 |
| 6,075,730 A | 6/2000 | Barth et al. | 365/191 |
| 6,075,744 A | 6/2000 | Tsern et al. | 365/230 |
| 6,078,546 A | 6/2000 | Lee | 365/233 |
| 6,079,025 A | 6/2000 | Fung | 713/323 |
| 6,084,434 A | 7/2000 | Keeth | 326/87 |
| 6,088,290 A | 7/2000 | Ohtake et al. | 365/233 |
| 6,091,251 A | 7/2000 | Wood et al. | 324/755 |
| RE36,839 E | 8/2000 | Simmons et al. | 326/93 |
| 6,101,152 A | 8/2000 | Farmwald et al. | 365/233 |
| 6,101,564 A | 8/2000 | Athenes et al. | |
| 6,101,612 A | 8/2000 | Jeddeloh | 713/401 |
| 6,108,795 A | 8/2000 | Jeddeloh | 713/401 |
| 6,111,812 A | 8/2000 | Gans et al. | 365/233 |
| 6,125,072 A | 9/2000 | Wu | |
| 6,134,638 A | 10/2000 | Olarig et al. | 711/167 |
| 6,154,370 A | 11/2000 | Degani et al. | |
| 6,166,991 A | 12/2000 | Phelan | 365/233 |
| 6,181,640 B1 | 1/2001 | Kang | |
| 6,182,184 B1 | 1/2001 | Farmwald et al. | 710/129 |
| 6,199,151 B1 | 3/2001 | Williams et al. | |
| 6,208,168 B1 | 3/2001 | Rhee | 326/83 |
| 6,216,246 B1 | 4/2001 | Shau | 714/763 |
| 6,222,739 B1 | 4/2001 | Bhakta et al. | |
| 6,226,709 B1 | 5/2001 | Goodwin et al. | |
| 6,226,730 B1 | 5/2001 | Murdoch et al. | |
| 6,233,192 B1 | 5/2001 | Tanaka | |
| 6,233,650 B1 | 5/2001 | Johnson et al. | |
| 6,240,048 B1 | 5/2001 | Matsubara | 365/233 |
| 6,243,282 B1 | 6/2001 | Rondeau et al. | 365/52 |
| 6,252,807 B1 | 6/2001 | Suzuki et al. | |
| 6,253,278 B1 | 6/2001 | Ryan | |
| 6,260,097 B1 | 7/2001 | Farmwald et al. | 710/129 |
| 6,260,154 B1 | 7/2001 | Jeddeloh | 713/401 |
| 6,262,938 B1 | 7/2001 | Lee et al. | 365/233 |
| 6,266,285 B1 | 7/2001 | Farmwald et al. | 365/194 |
| 6,266,292 B1 | 7/2001 | Tsern et al. | 365/230 |
| 6,274,395 B1 | 8/2001 | Weber | 438/14 |
| 6,279,069 B1 | 8/2001 | Robinson et al. | 711/103 |
| 6,295,572 B1 | 9/2001 | Wu | 710/131 |
| 6,297,966 B1 | 10/2001 | Lee et al. | |
| 6,298,426 B1 | 10/2001 | Ajanovic | 711/172 |
| 6,304,511 B1 | 10/2001 | Gans et al. | 365/233 |
| 6,307,769 B1 | 10/2001 | Nuxoll et al. | 365/63 |
| 6,314,051 B1 | 11/2001 | Farmwald et al. | 365/233 |
| 6,317,352 B1 | 11/2001 | Halbert et al. | 365/52 |
| 6,317,381 B1 | 11/2001 | Gans et al. | 365/233 |
| 6,324,120 B2 | 11/2001 | Farmwald et al. | 365/233 |
| 6,326,810 B1 | 12/2001 | Keeth | 326/83 |
| 6,327,664 B1 | 12/2001 | Dell et al. | 713/323 |
| 6,330,683 B1 | 12/2001 | Jeddeloh | 713/401 |
| 6,336,174 B1 | 1/2002 | Li et al. | |
| 6,338,108 B1 | 1/2002 | Motomura | 710/110 |
| 6,338,113 B1 | 1/2002 | Kubo et al. | 711/105 |
| 6,341,347 B1 | 1/2002 | Joy et al. | 712/228 |
| 6,343,019 B1 | 1/2002 | Jiang et al. | |
| 6,343,042 B1 | 1/2002 | Tsern et al. | 365/222 |
| 6,353,561 B1 | 3/2002 | Funyu et al. | 365/195 |
| 6,356,105 B1 | 3/2002 | Volk | 326/30 |
| 6,356,500 B1 | 3/2002 | Cloud et al. | 365/226 |
| 6,362,656 B2 | 3/2002 | Rhee | 326/87 |
| 6,363,031 B2 | 3/2002 | Phelan | 365/233 |
| 6,378,020 B2 | 4/2002 | Farmwald et al. | 710/129 |
| 6,381,188 B1 | 4/2002 | Choi et al. | 365/222 |
| 6,381,668 B1 | 4/2002 | Lunteren | 711/5 |
| 6,389,514 B1 | 5/2002 | Rokicki | |
| 6,392,304 B1 | 5/2002 | Butler | |
| 6,414,868 B1 | 7/2002 | Wong et al. | 365/51 |
| 6,418,034 B1 | 7/2002 | Weber et al. | |
| 6,421,754 B1 | 7/2002 | Kau et al. | |
| 6,424,532 B2 | 7/2002 | Kawamura | |
| 6,426,916 B2 | 7/2002 | Farmwald et al. | 365/233 |
| 6,429,029 B1 | 8/2002 | Eldridge et al. | 438/14 |
| 6,430,103 B2 | 8/2002 | Nakayama et al. | 365/230.03 |
| 6,434,660 B1 | 8/2002 | Lambert et al. | |
| 6,437,600 B1 | 8/2002 | Keeth | 326/86 |
| 6,438,057 B1 | 8/2002 | Ruckerbauer | 365/222 |
| 6,442,698 B2 | 8/2002 | Nizar | 13/320 |
| 6,445,591 B1 | 9/2002 | Kwong | |
| 6,452,826 B1 | 9/2002 | Kim et al. | |
| 6,452,863 B2 | 9/2002 | Farmwald et al. | 365/233 |
| 6,453,400 B1 | 9/2002 | Maesako et al. | 711/167 |
| 6,453,402 B1 | 9/2002 | Jeddeloh | 711/167 |
| 6,453,434 B2 | 9/2002 | Delp et al. | |
| 6,455,348 B1 | 9/2002 | Yamaguchi | |
| 6,457,095 B1 | 9/2002 | Volk | 711/105 |
| 6,459,651 B1 | 10/2002 | Lee et al. | 365/233 |
| 6,473,831 B1 | 10/2002 | Schade | 711/115 |
| 6,476,476 B1 | 11/2002 | Glenn | |
| 6,480,929 B1 | 11/2002 | Gauthier et al. | 711/105 |
| 6,487,102 B1 | 11/2002 | Halbert et al. | |
| 6,489,669 B2 | 12/2002 | Shimada et al. | |
| 6,490,161 B1 | 12/2002 | Johnson | |
| 6,492,726 B1 | 12/2002 | Quek et al. | |
| 6,493,789 B2 | 12/2002 | Ware et al. | 711/105 |
| 6,496,440 B2 | 12/2002 | Manning | 365/230.03 |
| 6,496,897 B2 | 12/2002 | Ware et al. | 711/105 |
| 6,498,766 B2 | 12/2002 | Lee et al. | 365/233 |
| 6,510,097 B2 | 1/2003 | Fukuyama | 365/230.03 |
| 6,510,503 B2 | 1/2003 | Gillingham et al. | 711/167 |
| 6,512,392 B2 | 1/2003 | Fleury et al. | 324/765 |
| 6,521,984 B2 | 2/2003 | Matsuura | |
| 6,526,471 B1 | 2/2003 | Shimomura et al. | 711/5 |
| 6,526,473 B1 | 2/2003 | Kim | |
| 6,526,484 B1 | 2/2003 | Stacovsky et al. | 711/158 |
| 6,545,895 B1 | 4/2003 | Li et al. | |
| 6,546,446 B2 | 4/2003 | Farmwald et al. | 710/305 |
| 6,553,450 B1 | 4/2003 | Dodd et al. | 711/105 |
| 6,560,158 B2 | 5/2003 | Choi et al. | 365/226 |
| 6,563,337 B2 | 5/2003 | Dour | 326/30 |
| 6,563,759 B2 | 5/2003 | Yahata et al. | 365/233 |
| 6,564,281 B2 | 5/2003 | Farmwald et al. | 710/305 |
| 6,564,285 B1 | 5/2003 | Mills et al. | 711/103 |
| 6,574,150 B2 | 6/2003 | Suyama et al. | 365/189.05 |
| 6,584,037 B2 | 6/2003 | Farmwald et al. | 365/233 |
| 6,587,912 B2 | 7/2003 | Leddige et al. | 711/5 |
| 6,590,822 B2 | 7/2003 | Hwang et al. | 365/222 |
| 6,594,770 B1 | 7/2003 | Sato et al. | 713/320 |

(56) References Cited

U.S. PATENT DOCUMENTS

| | | | |
|---|---|---|---|
| 6,597,616 B2 | 7/2003 | Tsern et al. | 365/222 |
| 6,597,617 B2 | 7/2003 | Ooishi et al. | |
| 6,614,700 B2 | 9/2003 | Dietrich et al. | 365/194 |
| 6,618,267 B1 | 9/2003 | Dalal et al. | |
| 6,618,791 B1 | 9/2003 | Dodd et al. | 711/105 |
| 6,621,760 B1 | 9/2003 | Ahmad et al. | 365/233 |
| 6,628,538 B2 | 9/2003 | Funaba et al. | |
| 6,629,282 B1 | 9/2003 | Sugamori et al. | |
| 6,630,729 B2 | 10/2003 | Huang | |
| 6,631,086 B1 | 10/2003 | Bill et al. | 365/185.09 |
| 6,639,820 B1 | 10/2003 | Khandekar et al. | |
| 6,646,939 B2 | 11/2003 | Kwak | |
| 6,650,588 B2 | 11/2003 | Yamagata | 365/222 |
| 6,650,594 B1 | 11/2003 | Lee et al. | 365/233 |
| 6,657,634 B1 | 12/2003 | Sinclair et al. | |
| 6,657,918 B2 | 12/2003 | Foss et al. | 365/233 |
| 6,657,919 B2 | 12/2003 | Foss et al. | 365/233 |
| 6,658,016 B1 | 12/2003 | Dai et al. | |
| 6,658,530 B1 | 12/2003 | Robertson et al. | 711/115 |
| 6,659,512 B1 | 12/2003 | Harper et al. | |
| 6,664,625 B2 | 12/2003 | Hiruma | |
| 6,665,224 B1 | 12/2003 | Lehmann et al. | 365/222 |
| 6,665,227 B2 | 12/2003 | Fetzer | 365/229 |
| 6,668,242 B1 | 12/2003 | Reynov et al. | |
| 6,674,154 B2 | 1/2004 | Minamio et al. | |
| 6,683,372 B1 | 1/2004 | Wong et al. | |
| 6,684,292 B2 | 1/2004 | Piccirillo et al. | |
| 6,690,191 B2 | 2/2004 | Wu et al. | |
| 6,697,295 B2 | 2/2004 | Farmwald et al. | 365/233 |
| 6,701,446 B2 | 3/2004 | Tsern et al. | 713/501 |
| 6,705,877 B1 | 3/2004 | Li et al. | |
| 6,708,144 B1 | 3/2004 | Merryman et al. | 703/14 |
| 6,710,430 B2 | 3/2004 | Minamio et al. | |
| 6,711,043 B2 | 3/2004 | Friedman et al. | |
| 6,713,856 B2 | 3/2004 | Tsai et al. | |
| 6,714,433 B2 | 3/2004 | Doblar et al. | |
| 6,714,891 B2 | 3/2004 | Dendinger | 702/132 |
| 6,724,684 B2 | 4/2004 | Kim | 365/233 |
| 6,730,540 B2 | 5/2004 | Siniaguine | |
| 6,731,009 B1 | 5/2004 | Jones et al. | |
| 6,731,527 B2 | 5/2004 | Brown | 365/63 |
| 6,742,098 B1 | 5/2004 | Halbert et al. | |
| 6,744,687 B2 | 6/2004 | Koo et al. | 365/226 |
| 6,747,887 B2 | 6/2004 | Halbert et al. | |
| 6,751,113 B2 | 6/2004 | Bhakta et al. | |
| 6,751,696 B2 | 6/2004 | Farmwald et al. | 710/305 |
| 6,754,129 B2 | 6/2004 | Khateri et al. | 365/226 |
| 6,754,132 B2 | 6/2004 | Kyung | 365/233 |
| 6,757,751 B1 | 6/2004 | Gene | |
| 6,762,948 B2 | 7/2004 | Kyun et al. | 365/51 |
| 6,765,812 B2 | 7/2004 | Anderson | |
| 6,766,469 B2 | 7/2004 | Larson et al. | |
| 6,771,526 B2 | 8/2004 | LaBerge | |
| 6,772,359 B2 | 8/2004 | Kwak et al. | |
| 6,779,097 B2 | 8/2004 | Gillingham et al. | 711/167 |
| 6,785,767 B2 | 8/2004 | Coulson | 711/112 |
| 6,791,877 B2 | 9/2004 | Miura et al. | 365/185 |
| 6,795,899 B2 | 9/2004 | Dodd et al. | 711/137 |
| 6,799,241 B2 | 9/2004 | Kahn et al. | 711/105 |
| 6,801,989 B2 | 10/2004 | Johnson et al. | 711/167 |
| 6,807,598 B2 | 10/2004 | Farmwald et al. | 710/305 |
| 6,807,650 B2 | 10/2004 | Lamb et al. | |
| 6,807,655 B1 | 10/2004 | Rehani et al. | 716/4 |
| 6,810,475 B1 | 10/2004 | Tardieux | |
| 6,816,991 B2 | 11/2004 | Sanghani | 714/733 |
| 6,819,602 B2 | 11/2004 | Seo et al. | 365/193 |
| 6,819,617 B2 | 11/2004 | Hwang et al. | 365/222 |
| 6,820,163 B1 | 11/2004 | McCall et al. | 710/310 |
| 6,820,169 B2 | 11/2004 | Wilcox et al. | 711/105 |
| 6,826,104 B2 | 11/2004 | Kawaguchi et al. | 365/222 |
| 6,839,290 B2 | 1/2005 | Ahmad et al. | 365/193 |
| 6,844,754 B2 | 1/2005 | Yamagata | |
| 6,845,027 B2 | 1/2005 | Mayer et al. | |
| 6,845,055 B1 | 1/2005 | Koga et al. | 365/229 |
| 6,847,582 B2 | 1/2005 | Pan | 365/233 |
| 6,850,449 B2 | 2/2005 | Takahashi | 365/222 |
| 6,854,043 B2 | 2/2005 | Hargis et al. | |
| 6,862,202 B2 | 3/2005 | Schaefer | |
| 6,862,249 B2 | 3/2005 | Kyung | 365/233 |
| 6,862,653 B1 | 3/2005 | Dodd et al. | 711/105 |
| 6,873,534 B2 | 3/2005 | Bhakta et al. | |
| 6,878,570 B2 | 4/2005 | Lyu et al. | |
| 6,894,933 B2 | 5/2005 | Kuzmenka et al. | 365/189.05 |
| 6,898,683 B2 | 5/2005 | Nakamura | 711/167 |
| 6,908,314 B2 | 6/2005 | Brown | 439/68 |
| 6,912,778 B2 | 7/2005 | Ahn et al. | 29/852 |
| 6,914,786 B1 | 7/2005 | Paulsen et al. | |
| 6,917,219 B2 | 7/2005 | New | 326/41 |
| 6,922,371 B2 | 7/2005 | Takahashi et al. | 365/227 |
| 6,930,900 B2 | 8/2005 | Bhakta et al. | |
| 6,930,903 B2 | 8/2005 | Bhakta et al. | |
| 6,938,119 B2 | 8/2005 | Kohn et al. | 11/105 |
| 6,943,450 B2 | 9/2005 | Fee et al. | |
| 6,944,748 B2 | 9/2005 | Sanches et al. | |
| 6,947,341 B2 | 9/2005 | Stubbs et al. | |
| 6,951,982 B2 | 10/2005 | Chye et al. | |
| 6,952,794 B2 | 10/2005 | Lu | |
| 6,961,281 B2 | 11/2005 | Wong et al. | 365/230.03 |
| 6,968,416 B2 | 11/2005 | Moy | 710/310 |
| 6,968,419 B1 | 11/2005 | Holman | 711/5 |
| 6,970,968 B1 | 11/2005 | Holman | 711/5 |
| 6,980,021 B1 | 12/2005 | Srivastava et al. | 326/30 |
| 6,986,118 B2 | 1/2006 | Dickman | 716/8 |
| 6,992,501 B2 | 1/2006 | Rapport | |
| 6,992,950 B2 | 1/2006 | Foss et al. | 365/233 |
| 7,000,062 B2 | 2/2006 | Perego et al. | 711/5 |
| 7,003,618 B2 | 2/2006 | Perego et al. | 711/5 |
| 7,003,639 B2 | 2/2006 | Tsern et al. | 711/154 |
| 7,007,095 B2 | 2/2006 | Chen et al. | |
| 7,007,175 B2 | 2/2006 | Chang et al. | 713/300 |
| 7,010,642 B2 | 3/2006 | Perego et al. | 711/5 |
| 7,010,736 B1 | 3/2006 | Teh et al. | 714/733 |
| 7,024,518 B2 | 4/2006 | Halbert et al. | 711/115 |
| 7,026,708 B2 | 4/2006 | Cady et al. | |
| 7,028,215 B2 | 4/2006 | Depew et al. | |
| 7,028,234 B2 | 4/2006 | Huckaby et al. | 714/710 |
| 7,033,861 B1 | 4/2006 | Partridge et al. | |
| 7,035,150 B2 | 4/2006 | Streif et al. | 365/194 |
| 7,043,599 B1 | 5/2006 | Ware et al. | 711/106 |
| 7,043,611 B2 | 5/2006 | McClannahan et al. | |
| 7,045,396 B2 | 5/2006 | Crowley et al. | |
| 7,045,901 B2 | 5/2006 | Lin et al. | |
| 7,046,538 B2 | 5/2006 | Kinsley et al. | |
| 7,053,470 B1 | 5/2006 | Sellers et al. | |
| 7,053,478 B2 | 5/2006 | Roper et al. | |
| 7,058,776 B2 | 6/2006 | Lee | 711/167 |
| 7,058,863 B2 | 6/2006 | Kouchi et al. | 714/718 |
| 7,061,784 B2 | 6/2006 | Jakobs et al. | |
| 7,061,823 B2 | 6/2006 | Faue et al. | 365/230.08 |
| 7,066,741 B2 | 6/2006 | Burns et al. | |
| 7,075,175 B2 | 7/2006 | Kazi et al. | 257/678 |
| 7,079,396 B2 | 7/2006 | Gates et al. | |
| 7,079,441 B1 | 7/2006 | Partsch et al. | 365/226 |
| 7,079,446 B2 | 7/2006 | Murtagh et al. | 365/233 |
| 7,085,152 B2 | 8/2006 | Ellis et al. | 365/149 |
| 7,085,941 B2 | 8/2006 | Li | 713/300 |
| 7,089,438 B2 | 8/2006 | Raad | 713/322 |
| 7,093,101 B2 | 8/2006 | Aasheim et al. | 711/207 |
| 7,103,730 B2 | 9/2006 | Saxena et al. | 711/156 |
| 7,110,322 B2 | 9/2006 | Farmwald et al. | |
| 7,111,143 B2 | 9/2006 | Walker | |
| 7,117,309 B2 | 10/2006 | Bearden | |
| 7,119,428 B2 | 10/2006 | Tanie et al. | |
| 7,120,727 B2 | 10/2006 | Lee et al. | 711/5 |
| 7,126,399 B1 | 10/2006 | Lee | 327/261 |
| 7,127,567 B2 | 10/2006 | Ramakrishnan et al. | |
| 7,133,960 B1 | 11/2006 | Thompson et al. | 711/5 |
| 7,136,978 B2 | 11/2006 | Miura et al. | 711/165 |
| 7,138,823 B2 | 11/2006 | Janzen et al. | |
| 7,149,145 B2 | 12/2006 | Kim et al. | 365/233 |
| 7,149,824 B2 | 12/2006 | Johnson | 710/35 |
| 7,173,863 B2 | 2/2007 | Conley et al. | 365/189 |
| 7,200,021 B2 | 4/2007 | Raghuram | 365/51 |
| 7,205,789 B1 | 4/2007 | Karabatsos | 326/30 |

(56) References Cited

U.S. PATENT DOCUMENTS

| | | | |
|---|---|---|---|
| 7,210,059 B2 | 4/2007 | Jeddeloh | |
| 7,215,561 B2 | 5/2007 | Park et al. | |
| 7,218,566 B1 | 5/2007 | Totolos, Jr. et al. | |
| 7,224,595 B2 | 5/2007 | Dreps et al. | 365/63 |
| 7,228,264 B2 | 6/2007 | Barrenscheen et al. | 703/23 |
| 7,231,562 B2 | 6/2007 | Ohlhoff et al. | |
| 7,233,541 B2 | 6/2007 | Yamamoto et al. | 365/230.03 |
| 7,234,081 B2 | 6/2007 | Nguyen et al. | |
| 7,243,185 B2 | 7/2007 | See et al. | |
| 7,245,541 B2 | 7/2007 | Janzen | 365/198 |
| 7,254,036 B2 | 8/2007 | Pauley et al. | 361/721 |
| 7,266,639 B2 | 9/2007 | Raghuram | 711/115 |
| 7,269,042 B2 | 9/2007 | Kinsley et al. | 365/52 |
| 7,269,708 B2 | 9/2007 | Ware | 711/203 |
| 7,274,583 B2 | 9/2007 | Park et al. | |
| 7,277,333 B2 | 10/2007 | Schaefer | |
| 7,286,436 B2 | 10/2007 | Bhakta et al. | 365/230 |
| 7,289,386 B2 | 10/2007 | Bhakta et al. | 65/236 |
| 7,296,754 B2 | 11/2007 | Nishizawa et al. | 235/492 |
| 7,299,330 B2 | 11/2007 | Gillingham et al. | 711/167 |
| 7,302,598 B2 | 11/2007 | Suzuki et al. | |
| 7,307,863 B2 | 12/2007 | Yen et al. | 365/63 |
| 7,317,250 B2 | 1/2008 | Koh et al. | |
| 7,336,490 B2 | 2/2008 | Harris et al. | |
| 7,337,293 B2 | 2/2008 | Brittain et al. | |
| 7,363,422 B2 | 4/2008 | Perego et al. | 711/105 |
| 7,366,947 B2 | 4/2008 | Gower et al. | |
| 7,379,316 B2 | 5/2008 | Rajan | 365/63 |
| 7,386,656 B2 | 6/2008 | Rajan et al. | 711/103 |
| 7,392,338 B2 | 6/2008 | Rajan et al. | 711/103 |
| 7,408,393 B1 | 8/2008 | Jain et al. | 327/202 |
| 7,409,492 B2 | 8/2008 | Tanaka et al. | 711/103 |
| 7,414,917 B2 | 8/2008 | Ruckerbauer et al. | |
| 7,428,644 B2 | 9/2008 | Jeddeloh et al. | |
| 7,437,579 B2 | 10/2008 | Jeddeloh et al. | 713/300 |
| 7,441,064 B2 | 10/2008 | Gaskins | |
| 7,457,122 B2 | 11/2008 | Lai et al. | |
| 7,464,225 B2 | 12/2008 | Tsern | 1/115 |
| 7,472,220 B2 | 12/2008 | Rajan et al. | 711/103 |
| 7,474,576 B2 | 1/2009 | Co et al. | |
| 7,480,147 B2 | 1/2009 | Hoss et al. | |
| 7,480,774 B2 | 1/2009 | Ellis et al. | |
| 7,496,777 B2 | 2/2009 | Kapil | 713/324 |
| 7,499,281 B2 | 3/2009 | Harris et al. | |
| 7,515,453 B2 | 4/2009 | Rajan | 365/63 |
| 7,532,537 B2 | 5/2009 | Solomon et al. | 365/230 |
| 7,539,800 B2 | 5/2009 | Dell et al. | |
| 7,573,136 B2 | 8/2009 | Jiang et al. | |
| 7,580,312 B2 | 8/2009 | Rajan et al. | |
| 7,581,121 B2 | 8/2009 | Barth et al. | |
| 7,581,127 B2 | 8/2009 | Rajan et al. | |
| 7,590,796 B2 | 9/2009 | Rajan et al. | |
| 7,599,205 B2 | 10/2009 | Rajan | |
| 7,606,245 B2 | 10/2009 | Ma et al. | |
| 7,609,567 B2 | 10/2009 | Rajan et al. | |
| 7,613,880 B2 | 11/2009 | Miura et al. | |
| 7,619,912 B2 | 11/2009 | Bhakta et al. | |
| 7,724,589 B2 | 5/2010 | Rajan et al. | |
| 7,730,338 B2 | 6/2010 | Rajan et al. | |
| 7,738,252 B2 | 6/2010 | Schuette et al. | |
| 7,761,724 B2 | 7/2010 | Rajan et al. | |
| 7,791,889 B2 | 9/2010 | Belady et al. | |
| 7,911,798 B2 | 3/2011 | Chang et al. | |
| 7,934,070 B2 | 4/2011 | Brittain et al. | |
| 7,990,797 B2 | 8/2011 | Moshayedi et al. | |
| 8,386,722 B1 * | 2/2013 | Wang et al. | 711/154 |
| 2001/0000822 A1 | 5/2001 | Dell et al. | 711/170 |
| 2001/0003198 A1 | 6/2001 | Wu | |
| 2001/0011322 A1 | 8/2001 | Stolt et al. | |
| 2001/0019509 A1 | 9/2001 | Aho et al. | |
| 2001/0021106 A1 | 9/2001 | Weber et al. | |
| 2001/0021137 A1 | 9/2001 | Kai et al. | |
| 2001/0046129 A1 | 11/2001 | Broglia et al. | |
| 2001/0046163 A1 | 11/2001 | Yanagawa | |
| 2001/0052062 A1 | 12/2001 | Lipovski | |
| 2002/0002662 A1 | 1/2002 | Olarig et al. | |
| 2002/0004897 A1 | 1/2002 | Kao et al. | |
| 2002/0015340 A1 | 2/2002 | Batinovich | |
| 2002/0019961 A1 | 2/2002 | Blodgett | 714/718 |
| 2002/0034068 A1 | 3/2002 | Weber et al. | |
| 2002/0038405 A1 | 3/2002 | Leddige et al. | 711/115 |
| 2002/0040416 A1 | 4/2002 | Tsern et al. | |
| 2002/0041507 A1 | 4/2002 | Woo et al. | 365/51 |
| 2002/0051398 A1 | 5/2002 | Mizugaki | 365/222 |
| 2002/0060945 A1 | 5/2002 | Ikeda | |
| 2002/0060948 A1 | 5/2002 | Chang et al. | |
| 2002/0064073 A1 | 5/2002 | Chien | 365/200 |
| 2002/0064083 A1 | 5/2002 | Ryu et al. | 365/233 |
| 2002/0089831 A1 | 7/2002 | Forthun | |
| 2002/0089970 A1 | 7/2002 | Asada et al. | |
| 2002/0094671 A1 | 7/2002 | Distefano et al. | |
| 2002/0121070 A1 | 9/2002 | Minamio et al. | |
| 2002/0121650 A1 | 9/2002 | Minamio et al. | |
| 2002/0124195 A1 | 9/2002 | Nizar | 713/320 |
| 2002/0129204 A1 | 9/2002 | Leighnor et al. | |
| 2002/0145900 A1 | 10/2002 | Schaefer | 365/52 |
| 2002/0165706 A1 | 11/2002 | Raynham | 703/25 |
| 2002/0167092 A1 | 11/2002 | Fee et al. | |
| 2002/0172024 A1 | 11/2002 | Hui et al. | |
| 2002/0174274 A1 | 11/2002 | Wu et al. | 710/100 |
| 2002/0184438 A1 | 12/2002 | Usui | 711/106 |
| 2003/0002262 A1 | 1/2003 | Benisek et al. | 361/728 |
| 2003/0011993 A1 | 1/2003 | Summers et al. | |
| 2003/0016550 A1 | 1/2003 | Yoo et al. | |
| 2003/0021175 A1 | 1/2003 | Tae Kwak | 365/219 |
| 2003/0026155 A1 | 2/2003 | Yamagata | |
| 2003/0026159 A1 | 2/2003 | Frankowsky et al. | |
| 2003/0035312 A1 | 2/2003 | Halbert et al. | |
| 2003/0039158 A1 | 2/2003 | Horiguchi et al. | |
| 2003/0041295 A1 | 2/2003 | Hou et al. | |
| 2003/0061458 A1 | 3/2003 | Wilcox et al. | 711/167 |
| 2003/0061459 A1 | 3/2003 | Aboulenein et al. | |
| 2003/0083855 A1 | 5/2003 | Fukuyama | |
| 2003/0088743 A1 | 5/2003 | Rader | |
| 2003/0093614 A1 | 5/2003 | Kohn et al. | 711/105 |
| 2003/0101392 A1 | 5/2003 | Lee | 714/718 |
| 2003/0105932 A1 | 6/2003 | David et al. | 711/167 |
| 2003/0110339 A1 | 6/2003 | Calvignac et al. | |
| 2003/0117875 A1 | 6/2003 | Lee et al. | 365/226 |
| 2003/0123389 A1 | 7/2003 | Russell et al. | |
| 2003/0126338 A1 | 7/2003 | Dodd et al. | 710/305 |
| 2003/0127737 A1 | 7/2003 | Takahashi | |
| 2003/0131160 A1 | 7/2003 | Hampel et al. | 710/22 |
| 2003/0145163 A1 | 7/2003 | Seo et al. | 711/106 |
| 2003/0158995 A1 | 8/2003 | Lee et al. | 711/105 |
| 2003/0164539 A1 | 9/2003 | Yau | |
| 2003/0164543 A1 | 9/2003 | Kheng Lee | |
| 2003/0174569 A1 | 9/2003 | Amidi | |
| 2003/0182513 A1 | 9/2003 | Dodd et al. | 711/137 |
| 2003/0183934 A1 | 10/2003 | Barrett | |
| 2003/0189868 A1 | 10/2003 | Riesenman et al. | 365/226 |
| 2003/0189870 A1 | 10/2003 | Wilcox | 365/233 |
| 2003/0191888 A1 | 10/2003 | Klein | 711/105 |
| 2003/0191915 A1 | 10/2003 | Saxena et al. | 711/160 |
| 2003/0200382 A1 | 10/2003 | Wells et al. | 711/106 |
| 2003/0200474 A1 | 10/2003 | Li | 713/320 |
| 2003/0205802 A1 | 11/2003 | Segaram et al. | |
| 2003/0206476 A1 | 11/2003 | Joo | |
| 2003/0217303 A1 | 11/2003 | Chua-Eoan et al. | |
| 2003/0223290 A1 | 12/2003 | Park et al. | 365/200 |
| 2003/0227798 A1 | 12/2003 | Pax | 365/189.12 |
| 2003/0229821 A1 | 12/2003 | Ma | 714/8 |
| 2003/0230801 A1 | 12/2003 | Jiang et al. | |
| 2003/0231540 A1 | 12/2003 | Lazar et al. | |
| 2003/0231542 A1 | 12/2003 | Zaharinova-Papazova et al. | 365/226 |
| 2003/0234664 A1 | 12/2003 | Yamagata | |
| 2004/0016994 A1 | 1/2004 | Huang | |
| 2004/0027902 A1 | 2/2004 | Ooishi et al. | |
| 2004/0034732 A1 | 2/2004 | Valin et al. | 711/4 |
| 2004/0034755 A1 | 2/2004 | LaBerge et al. | |
| 2004/0037133 A1 | 2/2004 | Park et al. | 365/702 |
| 2004/0042503 A1 | 3/2004 | Shaeffer et al. | |
| 2004/0044808 A1 | 3/2004 | Salmon et al. | 710/8 |

(56) References Cited

U.S. PATENT DOCUMENTS

| | | |
|---|---|---|
| 2004/0047228 A1 | 3/2004 | Chen ............................ 365/232 |
| 2004/0049624 A1 | 3/2004 | Salmonsen |
| 2004/0057317 A1 | 3/2004 | Schaefer |
| 2004/0064647 A1 | 4/2004 | DeWhitt et al. ............. 711/135 |
| 2004/0064767 A1 | 4/2004 | Huckaby et al. ............. 714/710 |
| 2004/0083324 A1 | 4/2004 | Rabinovitz et al. |
| 2004/0088475 A1 | 5/2004 | Streif et al. .................. 711/105 |
| 2004/0100837 A1 | 5/2004 | Lee |
| 2004/0117723 A1 | 6/2004 | Foss ............................. 714/805 |
| 2004/0123173 A1 | 6/2004 | Emberling et al. .......... 714/733 |
| 2004/0125635 A1 | 7/2004 | Kuzmenka |
| 2004/0133374 A1 | 7/2004 | Kattan |
| 2004/0133736 A1 | 7/2004 | Kyung .......................... 711/105 |
| 2004/0139359 A1 | 7/2004 | Samson et al. ............... 713/320 |
| 2004/0145963 A1 | 7/2004 | Byon ............................ 365/233 |
| 2004/0151038 A1 | 8/2004 | Ruckerbauer et al. |
| 2004/0174765 A1 | 9/2004 | Seo et al. ...................... 365/233 |
| 2004/0177079 A1 | 9/2004 | Gluhovsky et al. .......... 707/100 |
| 2004/0178824 A1 | 9/2004 | Pan |
| 2004/0184324 A1 | 9/2004 | Pax ........................... 365/189.12 |
| 2004/0186956 A1 | 9/2004 | Perego et al. ................ 711/115 |
| 2004/0188704 A1 | 9/2004 | Halbert et al. ............... 257/145 |
| 2004/0195682 A1 | 10/2004 | Kimura |
| 2004/0196732 A1 | 10/2004 | Lee ............................... 365/233 |
| 2004/0205433 A1 | 10/2004 | Gower et al. |
| 2004/0208173 A1 | 10/2004 | Di Gregorio ................. 370/360 |
| 2004/0225858 A1 | 11/2004 | Brueggen |
| 2004/0228166 A1 | 11/2004 | Braun et al. .................. 365/154 |
| 2004/0228196 A1 | 11/2004 | Kwak et al. |
| 2004/0228203 A1 | 11/2004 | Koo .............................. 365/233 |
| 2004/0230932 A1 | 11/2004 | Dickmann ..................... 716/10 |
| 2004/0236877 A1 | 11/2004 | Burton |
| 2004/0250989 A1 | 12/2004 | Im et al. |
| 2004/0256638 A1 | 12/2004 | Perego et al. ................ 257/200 |
| 2004/0257847 A1 | 12/2004 | Matsui et al. |
| 2004/0257857 A1 | 12/2004 | Yamamoto et al. |
| 2004/0260957 A1 | 12/2004 | Jeddeloh et al. ............. 713/300 |
| 2004/0264255 A1 | 12/2004 | Royer ....................... 365/189.01 |
| 2004/0268161 A1 | 12/2004 | Ross ............................. 713/300 |
| 2005/0018495 A1 | 1/2005 | Bhakta et al. ................. 365/19 |
| 2005/0021874 A1 | 1/2005 | Georgiou et al. ............ 709/250 |
| 2005/0024963 A1 | 2/2005 | Jakobs et al. |
| 2005/0027928 A1 | 2/2005 | Avraham et al. ............. 711/103 |
| 2005/0028038 A1 | 2/2005 | Pomaranski et al. ........... 714/42 |
| 2005/0034004 A1 | 2/2005 | Bunker et al. |
| 2005/0036350 A1 | 2/2005 | So et al. |
| 2005/0041504 A1 | 2/2005 | Perego et al. |
| 2005/0044302 A1 | 2/2005 | Pauley et al. |
| 2005/0044303 A1 | 2/2005 | Perego et al. ..................... 711/5 |
| 2005/0044305 A1 | 2/2005 | Jakobs et al. ................. 711/105 |
| 2005/0047192 A1 | 3/2005 | Matsui et al. ................ 365/145 |
| 2005/0071543 A1 | 3/2005 | Ellis et al. .................... 711/106 |
| 2005/0078532 A1 | 4/2005 | Ruckerbauer et al. ....... 365/199 |
| 2005/0081085 A1 | 4/2005 | Ellis et al. ........................ 714/5 |
| 2005/0086548 A1 | 4/2005 | Haid et al. |
| 2005/0099834 A1 | 5/2005 | Funaba et al. |
| 2005/0102590 A1 | 5/2005 | Norris et al. ................. 714/719 |
| 2005/0105318 A1 | 5/2005 | Funaba et al. |
| 2005/0108460 A1 | 5/2005 | David |
| 2005/0127531 A1 | 6/2005 | Tay et al. |
| 2005/0132158 A1 | 6/2005 | Hampel et al. ............... 711/167 |
| 2005/0135176 A1 | 6/2005 | Ramakrishnan et al. |
| 2005/0138267 A1 | 6/2005 | Bains et al. .................. 711/100 |
| 2005/0138304 A1 | 6/2005 | Ramakrishnan et al. |
| 2005/0139977 A1 | 6/2005 | Nishio et al. ................. 257/686 |
| 2005/0141199 A1 | 6/2005 | Chiou et al. .................. 361/704 |
| 2005/0149662 A1 | 7/2005 | Perego et al. ..................... 711/5 |
| 2005/0152212 A1 | 7/2005 | Yang et al. ................... 365/233 |
| 2005/0156934 A1 | 7/2005 | Perego et al. |
| 2005/0166026 A1 | 7/2005 | Ware et al. ...................... 1/167 |
| 2005/0193163 A1 | 9/2005 | Perego et al. ................ 711/105 |
| 2005/0193183 A1 | 9/2005 | Barth et al. |
| 2005/0194676 A1 | 9/2005 | Fukuda et al. |
| 2005/0194991 A1 | 9/2005 | Dour et al. ..................... 326/30 |
| 2005/0195629 A1 | 9/2005 | Leddige et al. ................ 365/51 |
| 2005/0201063 A1 | 9/2005 | Lee et al. |
| 2005/0204111 A1 | 9/2005 | Natarajan ..................... 711/167 |
| 2005/0207255 A1 | 9/2005 | Perego et al. |
| 2005/0210196 A1 | 9/2005 | Perego et al. ................ 711/115 |
| 2005/0223179 A1 | 10/2005 | Perego et al. ................ 711/154 |
| 2005/0224948 A1 | 10/2005 | Lee et al. |
| 2005/0232049 A1 | 10/2005 | Park |
| 2005/0235119 A1 | 10/2005 | Sechrest et al. .............. 711/158 |
| 2005/0235131 A1 | 10/2005 | Ware ............................ 711/203 |
| 2005/0237838 A1 | 10/2005 | Kwak et al. .................. 365/222 |
| 2005/0243635 A1 | 11/2005 | Schaefer ....................... 365/227 |
| 2005/0246558 A1 | 11/2005 | Ku |
| 2005/0249011 A1 | 11/2005 | Maeda |
| 2005/0259504 A1 | 11/2005 | Murtugh et al. .............. 365/233 |
| 2005/0263312 A1 | 12/2005 | Bolken et al. |
| 2005/0265506 A1 | 12/2005 | Foss et al. .................... 375/376 |
| 2005/0269715 A1 | 12/2005 | Yoo |
| 2005/0278474 A1 | 12/2005 | Perersen et al. ................... 711/5 |
| 2005/0281096 A1 | 12/2005 | Bhakta et al. |
| 2005/0281123 A1 | 12/2005 | Bell et al. ................. 365/230.08 |
| 2005/0283572 A1 | 12/2005 | Ishihara |
| 2005/0285174 A1 | 12/2005 | Saito et al. ................... 257/296 |
| 2005/0286334 A1 | 12/2005 | Saito et al. |
| 2005/0289292 A1 | 12/2005 | Morrow et al. .............. 711/105 |
| 2005/0289317 A1 | 12/2005 | Liou et al. .................... 711/170 |
| 2006/0002201 A1 | 1/2006 | Janzen .......................... 365/191 |
| 2006/0010339 A1 | 1/2006 | Klein ............................... 714/5 |
| 2006/0026484 A1 | 2/2006 | Hollums ....................... 714/746 |
| 2006/0038597 A1 | 2/2006 | Becker et al. |
| 2006/0039204 A1 | 2/2006 | Cornelius |
| 2006/0039205 A1 | 2/2006 | Cornelius ................. 365/189.05 |
| 2006/0041711 A1 | 2/2006 | Miura et al. .................. 711/103 |
| 2006/0041730 A1 | 2/2006 | Larson ......................... 711/167 |
| 2006/0044909 A1 | 3/2006 | Kinsley et al. ............... 365/222 |
| 2006/0044913 A1 | 3/2006 | Klein et al. |
| 2006/0049502 A1 | 3/2006 | Goodwin et al. |
| 2006/0050574 A1 | 3/2006 | Streif et al. ................... 365/194 |
| 2006/0056244 A1 | 3/2006 | Ware ............................ 365/194 |
| 2006/0062047 A1 | 3/2006 | Bhakta et al. |
| 2006/0067141 A1 | 3/2006 | Perego et al. |
| 2006/0085616 A1 | 4/2006 | Zeighami et al. ............ 711/167 |
| 2006/0087900 A1 | 4/2006 | Bucksch et al. |
| 2006/0090031 A1 | 4/2006 | Kirshenbaum et al. ...... 711/113 |
| 2006/0090054 A1 | 4/2006 | Choi et al. .................... 711/167 |
| 2006/0106951 A1 | 5/2006 | Bains ............................... 710/5 |
| 2006/0112214 A1 | 5/2006 | Yeh .............................. 711/103 |
| 2006/0112219 A1 | 5/2006 | Chawla et al. |
| 2006/0117152 A1 | 6/2006 | Amidi et al. ................. 711/154 |
| 2006/0117160 A1 | 6/2006 | Jackson et al. ............... 711/170 |
| 2006/0118933 A1 | 6/2006 | Haba |
| 2006/0120193 A1 | 6/2006 | Casper |
| 2006/0123265 A1 | 6/2006 | Ruckerbauer et al. |
| 2006/0126369 A1 | 6/2006 | Raghuram |
| 2006/0129712 A1 | 6/2006 | Raghuram ...................... 710/52 |
| 2006/0129740 A1* | 6/2006 | Ruckerbauer et al. ............ 711/5 |
| 2006/0129755 A1 | 6/2006 | Raghuram .................... 711/105 |
| 2006/0133173 A1 | 6/2006 | Jain et al. |
| 2006/0136791 A1 | 6/2006 | Nierle |
| 2006/0149857 A1 | 7/2006 | Holman |
| 2006/0149982 A1 | 7/2006 | Vogt ............................. 713/320 |
| 2006/0174082 A1 | 8/2006 | Bellows et al. |
| 2006/0176744 A1 | 8/2006 | Stave ............................ 365/194 |
| 2006/0179262 A1 | 8/2006 | Brittain et al. |
| 2006/0179333 A1 | 8/2006 | Brittain et al. ............... 713/320 |
| 2006/0179334 A1 | 8/2006 | Brittain et al. ............... 713/320 |
| 2006/0180926 A1 | 8/2006 | Mullen et al. |
| 2006/0181953 A1 | 8/2006 | Rotenberg et al. ....... 365/230.06 |
| 2006/0195631 A1 | 8/2006 | Rajamani |
| 2006/0198178 A1 | 9/2006 | Kinsley et al. |
| 2006/0203590 A1 | 9/2006 | Mori et al. |
| 2006/0206738 A1 | 9/2006 | Jeddeloh et al. ............. 713/320 |
| 2006/0233012 A1 | 10/2006 | Sekiguchi et al. |
| 2006/0236165 A1 | 10/2006 | Cepulis et al. |
| 2006/0236201 A1 | 10/2006 | Gower et al. |
| 2006/0248261 A1 | 11/2006 | Jacob et al. |
| 2006/0248387 A1 | 11/2006 | Nicholson et al. ............. 714/22 |
| 2006/0262586 A1 | 11/2006 | Solomon et al. |
| 2006/0262587 A1 | 11/2006 | Matsui et al. |
| 2006/0277355 A1 | 12/2006 | Ellsberry et al. |

(56) References Cited

U.S. PATENT DOCUMENTS

| | | | |
|---|---|---|---|
| 2006/0294295 A1 | 12/2006 | Fukuzo | 711/105 |
| 2007/0005998 A1 | 1/2007 | Jain et al. | |
| 2007/0050530 A1 | 3/2007 | Rajan | 711/5 |
| 2007/0058471 A1 | 3/2007 | Rajan et al. | 365/222 |
| 2007/0070669 A1 | 3/2007 | Tsern | |
| 2007/0088995 A1 | 4/2007 | Tsern et al. | 714/724 |
| 2007/0091696 A1 | 4/2007 | Niggemeier et al. | |
| 2007/0106860 A1 | 5/2007 | Foster, Sr. et al. | 711/170 |
| 2007/0136537 A1 | 6/2007 | Doblar et al. | |
| 2007/0152313 A1 | 7/2007 | Periaman et al. | |
| 2007/0162700 A1 | 7/2007 | Fortin et al. | 711/118 |
| 2007/0188997 A1 | 8/2007 | Hockanson et al. | |
| 2007/0192563 A1 | 8/2007 | Rajan et al. | 711/202 |
| 2007/0195613 A1 | 8/2007 | Rajan et al. | 365/189.05 |
| 2007/0204075 A1 | 8/2007 | Rajan et al. | |
| 2007/0216445 A1 | 9/2007 | Raghavan et al. | 326/83 |
| 2007/0247194 A1 | 10/2007 | Jain | 326/87 |
| 2007/0279084 A1 | 12/2007 | Oh et al. | |
| 2007/0285895 A1 | 12/2007 | Gruendler et al. | |
| 2007/0288683 A1 | 12/2007 | Panabaker et al. | 1/101 |
| 2007/0288686 A1 | 12/2007 | Arcedera et al. | 711/103 |
| 2007/0288687 A1 | 12/2007 | Panabaker et al. | 711/103 |
| 2007/0290333 A1 | 12/2007 | Saini et al. | |
| 2008/0002447 A1 | 1/2008 | Gulachenski et al. | |
| 2008/0010435 A1 | 1/2008 | Smith et al. | |
| 2008/0025108 A1 | 1/2008 | Rajan et al. | 365/189.05 |
| 2008/0025122 A1 | 1/2008 | Schakel et al. | 365/222 |
| 2008/0025136 A1 | 1/2008 | Rajan et al. | 365/230.08 |
| 2008/0025137 A1 | 1/2008 | Rajan et al. | 365/239 |
| 2008/0027697 A1 | 1/2008 | Rajan et al. | 703/14 |
| 2008/0027702 A1 | 1/2008 | Rajan et al. | 703/21 |
| 2008/0027703 A1 | 1/2008 | Rajan et al. | 703/21 |
| 2008/0028135 A1 | 1/2008 | Rajan et al. | |
| 2008/0028136 A1 | 1/2008 | Schakel et al. | 711/106 |
| 2008/0028137 A1 | 1/2008 | Schakel et al. | |
| 2008/0031030 A1 | 2/2008 | Rajan et al. | 365/63 |
| 2008/0031072 A1 | 2/2008 | Rajan et al. | 365/227 |
| 2008/0034130 A1 | 2/2008 | Perego et al. | |
| 2008/0037353 A1 | 2/2008 | Rajan et al. | 365/227 |
| 2008/0056014 A1 | 3/2008 | Rajan et al. | 365/189.03 |
| 2008/0062773 A1 | 3/2008 | Rajan et al. | 365/189.03 |
| 2008/0065820 A1 | 3/2008 | Gillingham et al. | 711/105 |
| 2008/0082763 A1 | 4/2008 | Rajan et al. | 711/154 |
| 2008/0086588 A1 | 4/2008 | Danilak et al. | |
| 2008/0089034 A1 | 4/2008 | Hoss et al. | |
| 2008/0098277 A1 | 4/2008 | Hazelzet | |
| 2008/0103753 A1 | 5/2008 | Rajan et al. | |
| 2008/0104314 A1 | 5/2008 | Rajan et al. | |
| 2008/0109206 A1 | 5/2008 | Rajan et al. | |
| 2008/0109595 A1 | 5/2008 | Rajan et al. | |
| 2008/0109597 A1 | 5/2008 | Schakel et al. | |
| 2008/0109598 A1 | 5/2008 | Schakel et al. | |
| 2008/0115006 A1 | 5/2008 | Smith et al. | 713/601 |
| 2008/0120443 A1 | 5/2008 | Rajan et al. | |
| 2008/0120458 A1 | 5/2008 | Gillingham et al. | 711/105 |
| 2008/0123459 A1 | 5/2008 | Rajan et al. | 365/227 |
| 2008/0126624 A1 | 5/2008 | Prete et al. | |
| 2008/0126687 A1 | 5/2008 | Rajan et al. | |
| 2008/0126688 A1 | 5/2008 | Rajan et al. | |
| 2008/0126689 A1 | 5/2008 | Rajan et al. | |
| 2008/0126690 A1 | 5/2008 | Rajan et al. | 1/105 |
| 2008/0126692 A1 | 5/2008 | Rajan et al. | |
| 2008/0130364 A1 | 6/2008 | Guterman et al. | |
| 2008/0133825 A1 | 6/2008 | Rajan et al. | |
| 2008/0155136 A1 | 6/2008 | Hishino | |
| 2008/0159027 A1 | 7/2008 | Kim | |
| 2008/0170425 A1 | 7/2008 | Rajan | |
| 2008/0195894 A1 | 8/2008 | Schreck et al. | |
| 2008/0215832 A1 | 9/2008 | Allen et al. | |
| 2008/0239857 A1 | 10/2008 | Rajan et al. | 365/227 |
| 2008/0239858 A1 | 10/2008 | Rajan et al. | 365/227 |
| 2008/0256282 A1 | 10/2008 | Guo et al. | |
| 2008/0282084 A1 | 11/2008 | Hatakeyama | |
| 2008/0282341 A1 | 11/2008 | Hatakeyama | |
| 2009/0024789 A1 | 1/2009 | Rajan et al. | |
| 2009/0024790 A1 | 1/2009 | Rajan et al. | |
| 2009/0049266 A1 | 2/2009 | Kuhne | |
| 2009/0063865 A1 | 3/2009 | Berenbaum et al. | |
| 2009/0063896 A1 | 3/2009 | Lastras-Montano et al. | |
| 2009/0070520 A1 | 3/2009 | Mizushima | |
| 2009/0089480 A1 | 4/2009 | Wah et al. | |
| 2009/0109613 A1 | 4/2009 | Legen et al. | |
| 2009/0180926 A1 | 7/2009 | Petruno et al. | |
| 2009/0216939 A1 | 8/2009 | Smith et al. | |
| 2009/0285031 A1 | 11/2009 | Rajan et al. | |
| 2009/0290442 A1 | 11/2009 | Rajan | |
| 2010/0005218 A1 | 1/2010 | Gower et al. | |
| 2010/0020585 A1 | 1/2010 | Rajan | |
| 2010/0257304 A1 | 10/2010 | Rajan et al. | |
| 2010/0271888 A1 | 10/2010 | Rajan | |
| 2010/0281280 A1 | 11/2010 | Rajan et al. | |

FOREIGN PATENT DOCUMENTS

| | | | |
|---|---|---|---|
| DE | 102005036528 | 2/2007 | G11C 7/10 |
| EP | 0644547 | 3/1995 | |
| JP | 62121978 | 6/1987 | G06F 12/06 |
| JP | 01171047 | 7/1989 | G11C 12/16 |
| JP | 03-029357 | 2/1991 | H01L 27/04 |
| JP | 03029357 | 2/1991 | H01L 21/822 |
| JP | 03/276487 | 12/1991 | G11C 11/401 |
| JP | 03286234 | 12/1991 | G06F 12/06 |
| JP | 05-298192 | 11/1993 | |
| JP | 07-141870 | 6/1995 | G11C 11/407 |
| JP | 08/077097 | 3/1996 | G06F 13/16 |
| JP | 08077097 | 3/1996 | G06F 12/00 |
| JP | 10233091 | 10/1998 | |
| JP | 11-149775 | 6/1999 | G11C 11/407 |
| JP | 2002025255 | 1/2002 | G11C 7/10 |
| JP | 3304893 B2 | 5/2002 | |
| JP | 2002288037 | 10/2002 | |
| JP | 04-327474 | 11/2004 | |
| JP | 2005062914 | 3/2005 | |
| JP | 2006236388 | 9/2006 | G06F 12/00 |
| KR | 1999-0076659 | 10/1999 | |
| KR | 1020040062717 | 7/2004 | G11C 5/02 |
| KR | 2005120344 | 12/2005 | |
| WO | WO 95/05676 | 2/1995 | H01L 25/00 |
| WO | WO97/25674 | 7/1997 | |
| WO | WO9900734 | 1/1999 | G11C 7/10 |
| WO | WO00/45270 | 8/2000 | |
| WO | WO01/37090 | 5/2001 | |
| WO | 01/90900 | 11/2001 | |
| WO | 01/97160 | 12/2001 | |
| WO | WO2004/044754 | 5/2004 | |
| WO | WO2004/051645 | 6/2004 | |
| WO | WO2006/072040 | 7/2006 | |
| WO | WO 2007002324 | 1/2007 | G11C 29/00 |
| WO | WO2007/028109 | 3/2007 | |
| WO | WO 2007/038225 | 4/2007 | G01V 5/00 |
| WO | WO2007/095080 | 8/2007 | |
| WO | WO2008063251 | 5/2008 | |

OTHER PUBLICATIONS

Wu et al., "eNVy: A Non-Volatile, Main Memory Storage System," to appear in ASPLOS VI.
"Using Two Chip Selects to Enable Quad Rank," IP.com PriorArtDatabase, copyright IP.com, Inc. 2004.
"BIOS and Kernel Developer's Guide (BKDG) for AMD Family 10h Processors," AMD, 31116 Rev 3.00, Sep. 7, 2007.
Skerlj et al., "Buffer Device for Memory Modules (DIMM)" Qimonda 2006, p. 1.
Written Opinion from PCT Application No. PCT/US06/24360 mailed on Jan. 8, 2007.
Preliminary Report on Patentability from PCT Application No. PCT/US06/24360 mailed on Jan. 10, 2008.
Written Opinion from International PCT Application No. PCT/US06/34390 mailed on Nov. 21, 2007.
International Search Report from PCT Application No. PCT/US06/34390 mailed on Nov. 21, 2007.
International Search Report and Written Opinion from PCT Application No. PCT/US07/16385 mailed on Jul. 30, 2008.

(56) References Cited

OTHER PUBLICATIONS

Office Action from U.S. Appl. No. 11/461,427 mailed on Sep. 5, 2008.
Final Office Action from U.S. Appl. No. 11/461,430 mailed on Sep. 8, 2008.
Notice of Allowance from U.S. Appl. No, 11/474,075 mailed on Nov. 26, 2008.
Office Action from U.S. Appl. No. 11/474,076 mailed on Nov. 3, 2008.
Office Action from U.S. Appl. No. 11/524,811 mailed on Sep. 17, 2008.
Non-final Office Action from U.S. Appl. No. 11/461,430 mailed on Feb. 19, 2009.
Final Office Action from U.S. Appl. No. 11/461,435 mailed on Jan. 28, 2009.
Non-final Office Action from U.S. Appl. No. 11/461,437 mailed on Jan. 26, 2009.
Non-final Office Action from U.S. Appl. No. 11/939,432 mailed on Feb. 6, 2009.
We et al., "eNVy: A Non-Volatile, Main Memory Storage System," ASPLOS-VI Proceedings—Sixth International Conference on Architectural Support for Programming Languages and Operating Systems, San Jose, California, Oct. 4-7, 1994, SIGARCH Computer Architecture News 22(Special Issue Oct. 1994).
Form AO-120 as filed in US Patent No. 7,472,220 on Jun. 17, 2009.
German Office Action From German Patent Application No. 11 2006 002 300.4-55 Mailed Jun. 5, 2009 (With Translation).
Non-Final Office Action From U.S. Appl. No. 11/461,430 Mailed Feb. 19, 2009.
Final Office Action From U.S. Appl. No. 11/461,435 Mailed Jan. 28, 2009.
Non-Final Office Action From U.S. Appl. No. 11/461,437 Mailed Jan. 26, 2009.
Non-Final Office Action From U.S. Appl. No. 11/461,441 Mailed Apr. 2, 2009.
Non-Final Office Action From U.S. Appl. No. 11/611,374 Mailed Mar. 23, 2009.
Non-Final Office Action From U.S. Appl. No. 11/762,010 Mailed Mar. 20, 2009.
Non-Final Office Action From U.S. Appl. No. 11/939,432 Mailed Feb. 6, 2009.
Non-Final Office Action From U.S. Appl. No. 12/111,819 Mailed Apr. 27, 2009.
Non-Final Office Action From U.S. Appl. No. 12/111,828 Mailed Apr. 17, 2009.
Supplemental European Search Report and Search Opinion issued on Sep. 21, 2009 in corresponding European Application No. 07870726.2, 8 pages.
Fang et al., W. Power Complexity Analysis of Adiabatic SRAM, 6th Int. Conference on ASIC, vol. 1, Oct. 2005, pp. 334-337.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
German Office Action From German Patent Application No. 11 2006 001 810.8-55 Mailed Apr. 20, 2009 (With Translation).
Final Rejection From U.S. Appl. No. 11/461,437 Mailed Nov. 10, 2009.
Final Rejection from U.S. Appl. No. 11/762,010 Mailed Dec. 4, 2009.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowance From U.S. Appl. No. 11/611,374 Mailed Nov. 30, 2009.
Notice of Allowance From U.S. Appl. No. 11/939,432 Mailed Dec. 1, 2009.
Notice of Allowance From U.S. Appl. No. 12/111,819 Mailed Nov. 20, 2009.
Notice of Allowance From U.S. Appl. No. 12/111,828 Mailed Dec. 15, 2009.
Great Britain Office Action from GB Patent Application No. GB0800734.6 Mailed Mar. 1, 2010.
Final Office Action from U.S. Appl. No. 11/461,420 Mailed Apr. 28, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Non-Final Office Action from U.S. Appl. No. 11/588,739 Mailed Dec. 29, 2009.
Notice of Allowance from U.S. Appl. No. 11/611,374 Mailed Apr. 5, 2010.
Non-Final Office Action from U.S. Appl. No. 11/828,181 Mailed Mar. 2, 2010.
Non-Final Office Action from U.S. Appl. No. 11/828,182 Mailed Mar. 29, 2010.
Final Office Action from U.S. Appl. No. 11/858,518 Mailed Apr. 21, 2010.
Non-Final Office Action from U.S. Appl. No. 11/929,432 Mailed Jan. 14, 2010.
Non-Final Office Action from U.S. Appl. No. 11/929,571 Mailed Mar. 3, 2010.
Non-Final Office Action from U.S. Appl. No. 11/929,631 Mailed Mar. 3, 2010.
Non-Final Office Action from U.S. Appl. No. 11/929,655 Mailed Mar. 3, 2010.
Non-Final Office Action from U.S. Appl. No. 11/939,432 Mailed Apr. 12, 2010.
Notice of Allowance from U.S. Appl. No. 12/111,819 Mailed Mar. 10, 2010.
Non-Final Office Action from U.S. Appl. No. 12/507,682 Mailed Mar. 8, 2010.
Great Britain Office Action from GB Patent Application No. GB0803913.3 Mailed Mar. 1, 2010.
Final Office Action from U.S. Appl. No. 11/461,435 Dated May 13, 2010.
Final Office Action from U.S. Appl. No. 11/515,167 Dated Jun. 3, 2010.
Notice of Allowance from U.S. Appl. No. 11/515,223 Dated Jul. 30, 2010.
Final Office Action from U.S. Appl. No. 11/553,390 Dated Jun. 24, 2010.
Notice of Allowance from U.S. Appl. No. 11/611,374 Dated Jul. 19, 2010.
Final Office Action from U.S. Appl. No. 11/672,921 Dated Jul. 23, 2010.
Final Office Action from U.S. Appl. No. 11/702,960 Dated Jun. 21, 2010.
Notice of Allowance from U.S. Appl. No. 11/762,010 Dated Jul. 2, 2010.
Notice of Allowance from U.S. Appl. No. 11/763,365 Dated Jun. 29, 2010.
Final Office Action from U.S. Appl. No. 11/929,500 Dated Jun. 24, 2010.
Office Action from U.S. Appl. No. 12/574,628 Dated Jun. 10, 2010.
Non-Final Office Action from U.S. Appl. No. 11/461,420 Dated Jul. 23, 2009.
Notice of Allowance from U.S. Appl. No. 11/461,430 Dated Sep. 9, 2009.
Non-Final Office Action from U.S. Appl. No. 11/461,435 Dated Aug. 5, 2009.
Non-Final Office Action from U.S. Appl. No. 11/515,167 Dated Sep. 25, 2009.
Non-Final Office Action from U.S. Appl. No. 11/515,223 Dated Sep. 22, 2009.
Non-Final Office Action from U.S. Appl. No. 11/538,041 Dated Jun. 10, 2009.

(56) References Cited

OTHER PUBLICATIONS

Non-Final Office Action from U.S. Appl. No. 11/553,372 Dated Jun. 25, 2009.
Notice of Allowance from U.S. Appl. No. 11/553,372 Dated Sep. 30, 2009.
Non-Final Office Action from U.S. Appl. No. 11/553,390 Dated Sep. 9, 2009.
Non-Final Office Action from U.S. Appl. No. 11/553,399 Dated Jul. 7, 2009.
Notice of Allowance from U.S. Appl. No. 11/553,399 Dated Oct. 13, 2009.
Notice of Allowance from U.S. Appl. No. 11/611,374 Dated Sep. 15, 2009.
Non-Final Office Action from U.S. Appl. No. 11/702,960 Dated Sep. 25, 2009.
Non-Final Office Action from U.S. Appl. No. 11/702,981 Dated Aug. 19, 2009.
Non-Final Office Action from U.S. Appl. No. 11/762,013 Dated Jun. 5, 2009.
Non-Final Office Action from U.S. Appl. No. 11/763,365 Dated Oct. 28, 2009.
Non-Final Office Action from U.S. Appl. No. 11/858,518 Dated Aug. 14, 2009.
Non-Final Office Action from U.S. Appl. No. 11/929,500 Dated Oct. 13, 2009.
Notice of Allowance from U.S. Appl. No. 11/939,432 Dated Sep. 24, 2009.
Non-Final Office Action from U.S. Appl. No. 11/941,589 Dated Oct. 1, 2009.
Wu et al., "eNVy: A Non-Volatile, Main Memory Storage System", ASPLOS-VI Proceedings, Oct. 4-7, 1994, pp. 86-97.
Buffer Device for Memory Modules (DIMM), IP.com Prior Art Database, <URL: http://ip.com/IPCOM/000144850>, Feb. 10, 2007, 1 pg.
German Office Action from German Patent Application No. 11 2006 002 300.4-55 Dated May 11, 2009 (With Translation).
Great Britain Office Action from GB Patent Application No. GB0803913.3 Dated Mar. 1, 2010.
International Preliminary Examination Report From PCT Application No. PCT/US07/016385 Dated Feb. 3, 2009.
Search Report and Written Opinion From PCT Application No. PCT/US07/03460 Dated on Feb. 14, 2008.
Notice of Allowance from U.S. Appl. No. 11/553,372 Dated Aug. 4, 2010.
Notice of Allowance from U.S. Appl. No. 11/553,399 Dated Dec. 3, 2010.
Notice of Allowance from U.S. Appl. No. 11/611,374 Dated Oct. 29, 2010.
Final Office Action from U.S. Appl. No. 11/672,924 Dated Sep. 7, 2010.
Non-Final Office Action from U.S. Appl. No. 11/702,981 Dated Mar. 11, 2009.
Notice of Allowance from U.S. Appl. No. 11/762,010 Dated Oct. 22, 2010.
Notice of Allowance from U.S. Appl. No. 11/762,013 Dated Aug. 17, 2010.
Notice of Allowance from U.S. Appl. No. 11/762,013 Dated Dec. 7, 2010.
Notice of Allowance from U.S. Appl. No. 11/763,365 Dated Oct. 20, 2010.
Non-Final Office Action from U.S. Appl. No. 11/855,805 Dated Sep. 21, 2010.
Non-Final Office Action from U.S. Appl. No. 11/858,518 Dated Sep. 8, 2010.
Final Office Action from U.S. Appl. No. 11/929,225 Dated Aug. 27, 2010.
Final Office Action from U.S. Appl. No. 11/929,261 Dated Sep. 7, 2010.
Final Office Action from U.S. Appl. No. 11/929,286 Dated Aug. 20, 2010.
Notice of Allowance from U.S. Appl. No. 11/929,320 Dated Sep. 29, 2010.
Final Office Action from U.S. Appl. No. 11/929,403 Dated Aug. 31, 2010.
Final Office Action from U.S. Appl. No. 11/929,417 Dated Aug. 31, 2010.
Final Office Action from U.S. Appl. No. 11/929,432 Dated Aug. 20, 2010.
Final Office Action from U.S. Appl. No. 11/929,450 Dated Aug. 20, 2010.
Notice of Allowance from U.S. Appl. No. 11/929,483 Dated Oct. 7, 2010.
Final Office Action from U.S. Appl. No. 11/929,631 Dated Nov. 18, 2010.
Final Office Action from U.S. Appl. No. 11/929,655 Dated Nov. 22, 2010.
Non-Final Office Action from U.S. Appl. No. 11/939,440 Dated Sep. 17, 2010.
Notice of Allowance from U.S. Appl. No. 11/941,589 Dated Oct. 25, 2010.
Non-Final Office Action from U.S. Appl. No. 12/057,306 Dated Oct. 8, 2010.
Non-Final Office Action from U.S. Appl. No. 12/203,100 Dated Dec. 1, 2010.
Non-Final Office Action from U.S. Appl. No. 12/769,428 Dated Nov. 8, 2010.
Non-Final Office Action from U.S. Appl. No. 12/838,896 Dated Sep. 3, 2010.
Search Report From PCT Application No. PCT/US10/038041 Dated Aug. 23, 2010.
Non-Final Office Action from U.S. Appl. No. 11/461,437 Dated Jan. 4, 2011.
Notice of Allowance from U.S. Appl. No. 11/515,223 Dated Feb. 4, 2011.
Non-Final Office Action from U.S. Appl. No. 11/553,372 Dated Jan. 5, 2011.
Final Office Action from U.S. Appl. No. 11/588,739 Dated Dec. 15, 2010.
Notice of Allowance from U.S. Appl. No. 11/762,010 Dated Feb. 18, 2011.
Final Office Action from U.S. Appl. No. 11/828,182 Dated Dec. 22, 2010.
Non-Final Office Action from U.S. Appl. No. 1/855,826 Dated Jan. 13, 2011.
Notice of Allowance from U.S. Appl. No. 11/939,432 Dated Feb. 18, 2011.
Notice of Allowance from U.S. Appl. No. 12/144,396 Dated Feb. 1, 2011.
Non-Final Office Action from U.S. Appl. No. 12/816,756 Dated Feb. 7, 2011.
Notice of Allowance from U.S. Appl. No. 11/762,013 Dated Feb. 22, 2011.
Notice of Allowance from U.S. Appl. No. 11/929,500 Dated Feb. 24, 2011.
Notice of Allowance from U.S. Appl. No. 11/763,365 Dated Mar. 1, 2011.
Final Office Action from U.S. Appl. No. 12/574,628 Dated Mar. 3, 2011.
Final Office Action from U.S. Appl. No. 11/929,571 Dated Mar. 3, 2011.
Notice of Allowance from U.S. Appl. No. 11/611,374 Dated Mar. 4, 2011.
Notice of Allowance from U.S. Appl. No. 11/929,483 Dated Mar. 4, 2011.
Notice of Allowance from U.S. Appl. No. 11/553,399 Dated Mar. 18, 2011.
Final Office Action from U.S. Appl. No. 12/507,682 Dated Mar. 29, 2011.
Non-Final Office Action from U.S. Appl. No. 11/929,403 Dated Mar. 31, 2011.
Office Action from U.S. Appl. No. 11/929,417 Dated Mar. 31, 2011.
Notice of Allowance from U.S. Appl. No. 12/838,896 Dated Apr. 19, 2011.

(56) References Cited

OTHER PUBLICATIONS

Notice of Allowance from U.S. Appl. No. 11/702,981 Dated Apr. 25, 2011.
Notice of Allowance from U.S. Appl. No. 11/929,320 Dated May 5, 2011.
Final Office Action from U.S. Appl. No. 11/939,440 Dated May 19, 2011.
Final Office Action from U.S. Appl. No. 11/855,805, Dated May 26, 2011.
Non-Final Office Action from U.S. Appl. No. 11/672,921 Dated May 27, 2011.
Notice of Allowance from U.S. Appl. No. 11/762,010 Dated Jun. 8, 2011.
Non-Final Office Action from U.S. Appl. No. 11/672,924 Dated Jun. 8, 2011.
Non-Final Office Action from U.S. Appl. No. 11/929,225 Dated Jun. 8, 2011.
Notice of Allowance from U.S. Appl. No. 11/929,500 Dated Jun. 13, 2011.
Notice of Allowance from U.S. Appl. No. 11/941,589 Dated Jun. 15, 2011.
Final Office Action from U.S. Appl. No. 12/057,306 Dated Jun. 15, 2011.
Final Office Action from U.S. Appl. No. 12/769,428 Dated Jun. 16, 2011.
Notice of Allowance from U.S. Appl. No. 12/203,100 Dated Jun. 17, 2011.
Notice of Allowance from U.S. Appl. No. 11/762,013 Dated Jun. 20, 2011.
Non-Final Office Action from U.S. Appl. No. 12/797,557 Dated Jun. 21, 2011.
Notice of Allowance from U.S. Appl. No. 11/929,483 Dated Jun. 23, 2011.
Non-Final Office Action from U.S. Appl. No. 11/702,960 Dated Jun. 23, 2011.
Non-Final Office Action from U.S. Appl. No. 11/929,655 Dated Jun. 24, 2011.
Notice of Allowance from U.S. Appl. No. 11/763,365 Dated Jun. 24, 2011.
Notice of Allowance from U.S. Appl. No. 11/611,374 Dated Jun. 24, 2011.
Non-Final Office Action from U.S. Appl. No. 11/828,182 Dated Jun. 27, 2011.
Non-Final Office Action from U.S. Appl. No. 11/828,181 Dated Jun. 27, 2011.
Non-Final Office Action from U.S. Appl. No. 12/378,328 Dated Jul. 15, 2011.
Final Office Action from U.S. Appl. No. 11/461,420 Dated Jul. 20, 2011.
Notice of Allowance from U.S. Appl. No. 11/461,437 Dated Jul. 25, 2011.
Notice of Allowance from U.S. Appl. No. 11/702,981 Dated Aug. 5, 2011.
Notice of Allowability from U.S. Appl. No. 11/855,826 Dated Aug. 15, 2011.
Non-Final Office Action from U.S. Appl. No. 12/574,628 Dated Sep. 20, 2011.
Non-Final Office Action from U.S. Appl. No. 11/858,518 Dated Sep. 27, 2011.
Notice of Allowance from U.S. Appl. No. 11/929,571 Dated Sep. 27, 2011.
Notice of Allowance from U.S. Appl. No. 11/929,500 Dated Sep. 27, 2011.
Notice of Allowance from U.S. Appl. No. 11/941,589 Dated Sep. 30, 2011.
Notice of Allowance from U.S. Appl. No. 12/816,756 Dated Oct. 3, 2011.
Non-Final Office Action from U.S. Appl. No. 12/508,496 Dated Oct. 11, 2011.
Non-Final Office Action from U.S. Appl. No. 11/588,739 Dated Oct. 13, 2011.
Notice of Allowance from U.S. Appl. No. 11/939,432 Dated Oct. 24, 2011.
Non-Final Office Action from U.S. Appl. No. 11/929,631 Dated Nov. 1, 2011.
Non-Final Office Action from U.S. Appl. No. 11/553,372 Dated Nov. 14, 2011.
Notice of Allowance from U.S. Appl. No. 11/515,223 Dated Nov. 29, 2011.
Notice of Allowance from U.S. Appl. No. 12/769,428 Dated Nov. 29, 2011.
Final Office Action from U.S. Appl. No. 11/939,440 Dated Dec. 12, 2011.
Notice of Allowance from U.S. Appl. No. 12/797,557 Dated Dec. 28, 2011.
Office Action, including English translation, from related Japanese application No. 2008-529353, Dated Jan. 10, 2012.
Notice of Allowance from U.S. Appl. No. 12/838,896 Dated Jan. 18, 2012.
Final Office Action from U.S. Appl. No. 11/929,655 Dated Jan. 19, 2012.
Final Office Action from U.S. Appl. No. 12/378,328 Dated Feb. 3, 2012.
Final Office Action from U.S. Appl. No. 11/672,921 Dated Feb. 16, 2012.
Final Office Action from U.S. Appl. No. 11/672,924 Dated Feb. 16, 2012.
Final Office Action from U.S. Appl. No. 11/929,225 Dated Feb. 16, 2012.
Final Office Action from U.S. Appl. No. 11/828,181 Dated Feb. 23, 2012.
Non-Final Office Action from U.S. Appl. No. 13/276,212 Dated Mar. 15, 2012.
Office Action, including English translation, from co-pending Japanese application No. 2008-529353, Dated Jan. 10, 2012.
International Search Report for Application No. EP12150807 Dated Feb. 16, 2012.
Non-Final Office Action from U.S. Appl. No. 11/461,520 Dated Feb. 29, 2012.
Notice of Allowance from U.S. Appl. No. 12/574,628 Dated Mar. 6, 2012.
Non-Final Office Action from U.S. Appl. No. 13/343,612 Dated Mar. 29, 2012.
Notice of Allowance from U.S. Appl. No. 11/939,440 Dated Mar. 30, 2012.
European Search Report from co-pending European application No. 11194876.6-2212/2450798, Dated Apr. 12, 2012.
European Search Report from co-pending European application No. 11194862.6-2212/2450800, Dated Apr. 12, 2012.
Notice of Allowance from U.S. Appl. No. 11/929,636, Dated Apr. 17, 2012.
Final Office Action from U.S. Appl. No. 11/858,518, Dated Apr. 17, 2012.
European Search Report from co-pending European application No. 11194883.2-2212, Dated Apr. 27, 2012.
Non-Final Office Action from U.S. Appl. No. 11/553,372, Dated May 3, 2012.
Notice of Allowance from U.S. Appl. No. 11/929,631, Dated May 3, 2012.
Non-Final Office Action from U.S. Appl. No. 13/165,713, Dated May 22, 2012.
Non-Final Office Action from U.S. Appl. No. 12/144,396, Dated May 29, 2012.
Non-Final Office Action from U.S. Appl. No. 13/165,713, Dated May 31, 2012.
Non-Final Office Action from U.S. Appl. No. 13/280,251, Dated Jun. 12, 2012.
Final Office Action from U.S. Appl. No. 11/855,805, Dated Jun. 14, 2012.
U.S. Appl. No. 13/620,425, filed Sep. 14, 2012, Rajan et al., Memory Module With Memory Stack and Interface with Enhanced Capabilities.

(56) References Cited

OTHER PUBLICATIONS

U.S. Appl. No. 13/620,565, filed Sep. 14, 2012, Rajan et al., Methods and Apparatus of Stacking DRAMS.
U.S. Appl. No. 13/620,424, filed Sep. 14, 2012, Danilak et al., System and Method for Increasing Capacity, Performance, and Flexibility of Flash Storage.
U.S. Appl. No. 13/615,008, filed Sep. 13, 2012, Smith et al., Adjusting the Timing of Signals Associated With a Memory System.
U.S. Appl. No. 13/620,650, filed Sep. 14, 2012, Rajan et al., System and Method for Translating an Address Associated With a Command Communicated Between a System and Memory Circuits.
U.S. Appl. No. 13/618,246, filed Sep. 14, 2012, Smith et al., Memory Modules With Reliability and Serviceability Functions.
U.S. Appl. No. 13/620,645, filed Sep. 14, 2012, Schakel et al., Method and Apparatus for Refresh Management of Memory Modules.
U.S. Appl. No. 13/620,412, filed Sep. 14, 2012, Zohni et al., Embossed Heat Spreader.
U.S. Appl. No. 13/620,793, filed Sep. 15, 2012, Rosenband et al., Hybrid Memory Module.
U.S. Appl. No. 13/620,207, filed Sep. 14, 2012, Raj an et al., Configurable Memory System.
Office Action, including English translation, from co-pending Japanese application No. 2008-529353, dated Jul. 31, 2012.
Final Office Action from U.S. Appl. No. 13/315,933, Dated Aug. 24, 2012.
Final Office Action from U.S. Appl. No. 13/276,212, Dated Aug. 30, 2012.
Non-Final Office Action from U.S. Appl. No. 13/367,182, Dated Aug. 31, 2012.
Notice of Allowance from U.S. Appl. No. 11/461,420, Dated Sep. 5, 2012.
Final Office Action from U.S. Appl. No. 13/280,251, Dated Sep. 12, 2012.
Non-Final Office Action from U.S. Appl. No. 11/929,225, Dated Sep. 17, 2012.
Notice of Allowance from U.S. Appl. No. 12/508,496, Dated Sep. 17, 2012.
Non-Final Office Action from U.S. Appl. No. 11/672,921, Dated Oct. 1, 2012.
Notice of Allowance from U.S. Appl. No. 12/057,306, Dated Oct. 10, 2012.
Notice of Allowance from U.S. Appl. No. 12/144,396, Dated Oct. 11, 2012.
Non-Final Office Action from U.S. Appl. No. 13/411,489, Dated Oct. 17, 2012.
Non-Final Office Action from U.S. Appl. No. 13/471,283, Dated Dec. 7, 2012.
English translation of Office Action from co-pending Korean patent application No. KR1020087005172, dated Dec. 20, 2012.
Office Action, including English translation, from co-pending Japanese application No. 2008-529353, Dated Dec. 27, 2012.
Office Action from co-pending European patent application No. EP12150798, Dated Jan. 3, 2013.
Final Office Action from U.S. Appl. No. 11/672,924, Dated Feb. 1, 2013.
Non-Final Office Action from U.S. Appl. No. 13/260,650, Dated Feb. 1, 2013.
Notice of Allowance from U.S. Appl. No. 13/141,844, Dated Feb. 5, 2013.
Notice of Allowance from U.S. Appl. No. 13/473,827, Dated Feb. 15, 2013.
Notice of Allowance from U.S. Appl. No. 12/378,328, Dated Feb. 27, 2013.
Non-Final Office Action from U.S. Appl. No. 13/536,093, Dated Mar. 1, 2013.
Notice of Allowance from U.S. Appl. No. 11/461,435, Dated Mar. 6, 2013.
Notice of Allowance from U.S. Appl. No. 13/471,283, Dated Mar. 21, 2013.
Extended European Search Report for co-pending European patent application No. EP12150807.1, dated Feb. 1, 2013, mailed Mar. 22, 2013.
Notice of Allowance from U.S. Appl. No. 13/181,716, Dated Apr. 3, 2013.
English translation of Office Action from co-pending Korean patent application No. KR1020087019582, Dated Mar. 13, 2013.
Notice of Allowance from U.S. Appl. No. 13/618,246, Dated Apr. 23, 2013.
Notice of Allowance from U.S. Appl. No. 13/182,234, Dated May 1, 2013.
Final Office Action from U.S. Appl. No. 13/315,933, Dated May 3, 2013.
English Translation of Office Action from co-pending Korean patent application No. 10-2013-7004006, Dated Apr. 12, 2013.
EPO Communication for Co-pending European patent application No. EP11194862.6, dated May 5, 2013.
Non-Final Office Action from U.S. Appl. No. 13/620,793, Dated May 6, 2013.
Non-Final Office Action from U.S. Appl. No. 13/620,565, Dated May 24, 2013.
Final Office Action from U.S. Appl. No. 11/929,225, Dated May 24, 2013.
Final Office Action from U.S. Appl. No. 11/672,921, Dated May 24, 2013.
Notice of Allowance from U.S. Appl. No. 11/929,631, Dated May 28, 2013.
Notice of Allowance from U.S. Appl. No. 13/620,424, Dated May 29, 2013.
Notice of Allowance from U.S. Appl. No. 13/341,844, Dated May 30, 2013.
Non-Final Office Action from U.S. Appl. No. 13/455,691, Dated Jun. 4, 2013.
Non-Final Office Action from U.S. Appl. No. 13/620,207, Dated Jun. 20, 2013.
Non-Final Office Action from U.S. Appl. No. 11/828,182, Dated Jun. 20, 2013.
Final Office Action from U.S. Appl. No. 11/828,181, Dated Jun. 20, 2013.
Non-Final Office Action from U.S. Appl. No. 11/929,655, Dated Jun. 21, 2013.
Notice of Allowance from U.S. Appl. No. 13/597,895, Dated Jun. 25, 2013.
Non-Final Office Action from U.S. Appl. No. 13/620,645, Dated Jun. 26, 2013.
Notice of Allowance from U.S. Appl. No. 13/471,283, Dated Jun. 28, 2013.
Notice of Allowance from U.S. Appl. No. 13/181,747, Dated Jul. 9, 2013.
Notice of Allowance from U.S. Appl. No. 11/515,223, Dated Jul. 18, 2013.
Notice of Allowance from U.S. Appl. No. 13/182,234, Dated Jul. 22, 2013.
Notice of Allowance from U.S. Appl. No. 13/181,716, Dated Jul. 22, 2013.
Non-Final Office Action from U.S. Appl. No. 13/620,233, Dated Aug. 2, 2013.
Final Office Action from U.S. Appl. No. 13/367,182, Dated Aug. 8, 2013.
Notice of Allowance from U.S. Appl. No. 13/615,008, Dated Aug. 15, 2013.
Notice of Allowance from U.S. Appl. No. 13/620,425, Dated Aug. 20, 2013.
Non-Final Office Action from U.S. Appl. No. 13/620,601, Dated Aug. 23, 2013.
Non-Final Office Action from U.S. Appl. No. 13/315,933, Dated Aug. 27, 2013.
Final Office Action from U.S. Appl. No. 13/620,650, Dated Aug. 30, 2013.
Notice of Allowance from U.S. Appl. No. 13/620,424, Dated Sep. 11, 2013.
Non-Final Office Action from U.S. Appl. No. 13/620,291, Dated Sep. 12, 2013.

(56) References Cited

OTHER PUBLICATIONS

Notice of Allowance from U.S. Appl. No. 13/341,844, Dated Sep. 17, 2013.
Notice of Allowance from U.S. Appl. No. 13/620,412, dated Sep. 25, 2013.
Non-Final Office Action from U.S. Appl. No. 13/343,852, dated Sep. 27, 2013.
English Translation of Office Action from co-pending Korean patent application No. 10-2008-7019582, dated Sep. 16, 2013.
Notice of Allowance from U.S. Appl. No. 13/620,565, dated Sep. 27, 2013.
Non-Final Office Action from U.S. Appl. No. 13/279,068, dated Sep. 30, 2013.
Notice of Allowance from U.S. Appl. No. 13/620,207, dated Oct. 9, 2013.
Non-Final Office Action from U.S. Appl. No. 13/898,002, dated Oct. 10, 2013.
Notice of Allowance from U.S. Appl. No. 13/471,283, dated Oct. 15, 2013.
Notice of Allowance from U.S. Appl. No. 11/515,223, dated Oct. 24, 2013.
Notice of Allowance from U.S. Appl. No. 13/181,747, dated Oct. 28, 2013.
Notice of Allowance from U.S. Appl. No. 13/597,895, dated Oct. 29, 2013.
Final Office Action from U.S. Appl. No. 13/620,793, dated Nov. 13, 2013.
Notice of Allowance from U.S. Appl. No. 13/618,246, dated Nov. 14, 2013.
Notice of Allowance from U.S. Appl. No. 13/473,827, dated Nov. 20, 2013.
Notice of Allowance from U.S. Appl. No. 13/615,008, dated Dec. 3, 2013.
Notice of Allowance from U.S. Appl. No. 13/620,425, dated Dec. 11, 2013.
English Translation of Office Action from co-pending Japanese patent application No. P2012-197675, Dec. 3, 2013.
English Translation of Office Action from co-pending Japanese patent application No. P2012-197678, Dec. 3, 2013.
Notice of Allowance from U.S. Appl. No. 13/455,691, dated Dec. 31, 2013.
Non-Final Office Action from U.S. Appl. No. 11/553,390, dated Dec. 31, 2013.
English Translation of Office Action from co-pending Korean patent application No. 10-2013-7004006, dated Dec. 26, 2013.
Search Report from co-pending European Patent Application No. 13191794, dated Dec. 12, 2013.
Notice of Allowance from Application No. 13/620,425, dated Jan. 13, 2014.
Office Action from co-pending Korean patent application No. 10-2013-7029741, dated Dec. 20, 2013.
Notice of Allowance from U.S. Appl. No. 13/279,068, dated Jan. 21, 2014.
Notice of Allowance from U.S. Appl. No. 13/620,412, dated Jan. 21, 2014.
Non-Final Office Action from U.S. Appl. No. 13,367,182, dated Jan. 29, 2014.
Notice of Allowance from U.S. Appl. No. 13/898,002, dated Feb. 3, 2014.
Search Report from co-pending European Patent Application No. 13191796, dated Feb. 10, 2014.
Notice of Allowance from U.S. Appl. No. 13/620,412, dated Feb. 11, 2014.

\* cited by examiner

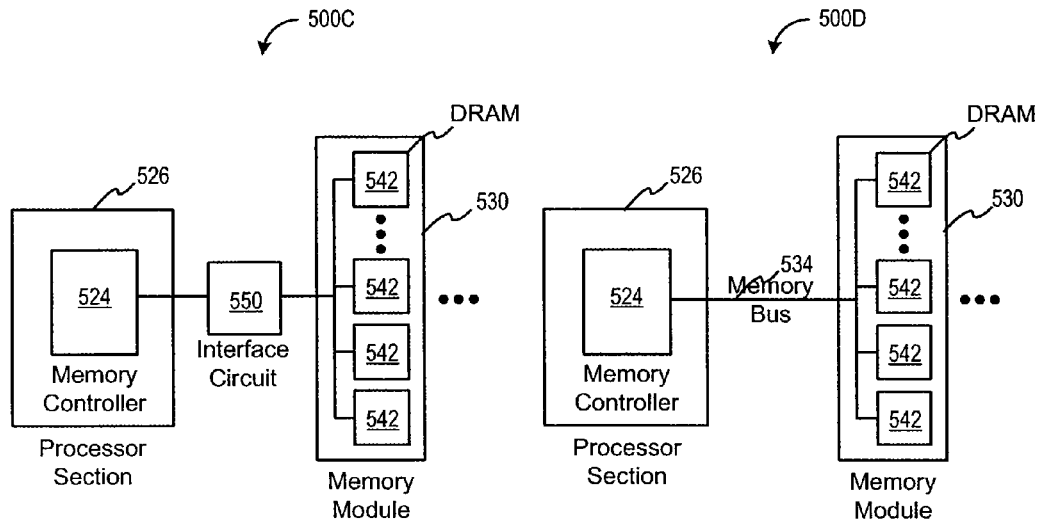
FIG. 5C
FIG. 5D
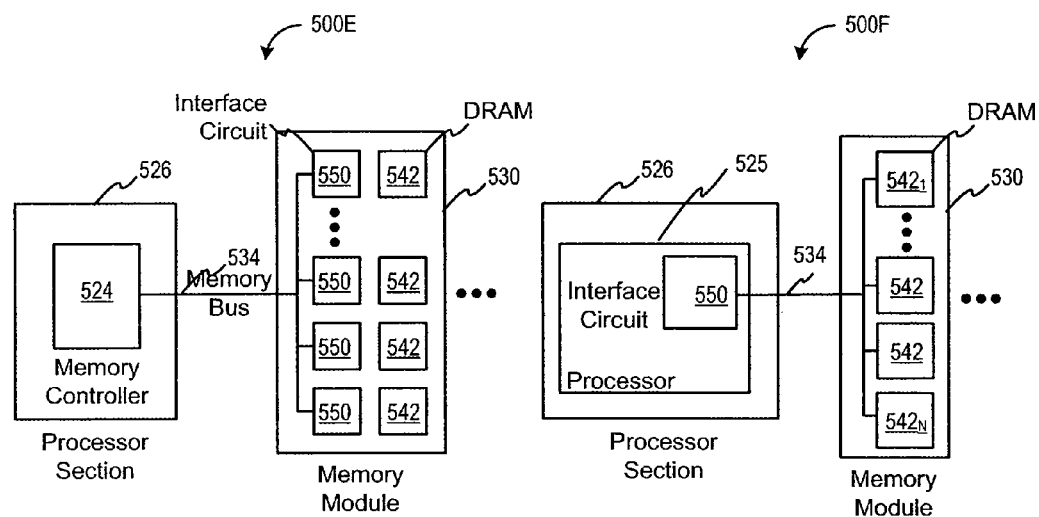
FIG. 5E
FIG. 5F

MEMORY SYSTEM FOR SYNCHRONOUS DATA TRANSMISSION

CROSS-REFERENCE TO RELATED APPLICATIONS

This application is a continuation of U.S. patent application Ser. No. 12/144,396, filed Jun. 23, 2008, now U.S. Pat. No. 8,386,722, the subject matter of which is hereby incorporated herein by reference.

BACKGROUND OF THE INVENTION

1. Field of the Invention

Embodiments of the present invention generally relate to memory subsystems and, more specifically, to improvements to such memory subsystems.

2. Description of the Related Art

Memory circuit speeds remain relatively constant, but the required data transfer speeds and bandwidth of memory systems are increasing, currently doubling every three years. The result is that more commands must be scheduled, issued and pipelined in a memory system to increase bandwidth. However, command scheduling constraints that exist in the memory systems limit the command issue rates, and consequently, limit the increase in bandwidth.

In general, there are two classes of command scheduling constraints that limit command scheduling and command issue rates in memory systems: inter-device command scheduling constraints, and intra-device command scheduling constraints. These command scheduling constraints and other timing constraints and timing parameters are defined by manufacturers in their memory device data sheets and by standards organizations such as JEDEC.

Examples of inter-device (between devices) command scheduling constraints include rank-to-rank data bus turnaround times, and on-die-termination (ODT) control switching times. The inter-device command scheduling constraints typically arise because the devices share a resource (for example a data bus) in the memory sub-system.

Examples of intra-device (inside devices) command-scheduling constraints include column-to-column delay time (tCCD), row-to-row activation delay time (tRRD), four-bank activation window time (tFAW), and write-to-read turnaround time (tWTR). The intra-device command-scheduling constraints typically arise because parts of the memory device (e.g. column, row, bank, etc.) share a resource inside the memory device.

In implementations involving more than one memory device, some technique must be employed to assemble the various contributions from each memory device into a word or command or protocol as may be processed by the memory controller. Various conventional implementations, in particular designs within the classification of Fully Buffered DIMMs (FBDIMMs, a type of industry standard memory module) are designed to be capable of such assembly. However, there are several problems associated with such an approach. One problem is that the FBDIMM approach introduces significant latency (see description, below). Another problem is that the FBDIMM approach requires a specialized memory controller capable of processing the assembly.

As memory speed increases, the introduction of latency becomes more and more of a detriment to the operation of the memory system. Even modern FBDIMM-type memory systems introduce 10 s of nanoseconds of delay as the packet is assembled. As will be shown in the disclosure to follow, the latency introduced need not be so severe.

Moreover, the implementation of the FBDIMM-type memory devices required corresponding changes in the behavior of the memory controller, and this FBDIMMS are not backward compatible among industry-standard memory system. As will be shown in the disclosure to follow, various embodiments of the present invention may be used with previously existing memory controllers, without modification to their logic or interfacing requirements.

In order to appreciate the extent of the introduction of latency in an FBDIMM-type memory system, one needs to refer to FIG. 1. FIG. 1 shows an FBDIMM-type memory system 100 wherein multiple DRAMS (D0, D1, . . . D7, D8) are in communication via a daisy-chained interconnect. The buffer 105 is situated between two memory circuits (e.g. D1 and D2). In the READ path, the buffer 105 is capable to present to memory $D_N$ the data retrieved from $D_M$ (M>N). Of course in a conventional FBDIMM-type system, the READ data from each successively higher memory $D_M$ must be merged with the data of memory $D_N$, and such function is implemented via pass-through and merging logic 106. As can be seen, such an operation occurs sequentially at each buffer 105, and latency is thus cumulatively introduced.

As the foregoing illustrates, what is needed in the art is a memory subsystem and method that overcome the shortcomings of prior art systems.

SUMMARY OF THE INVENTION

One embodiment of the present invention sets forth an interface circuit configured to combine a plurality of data bursts returned by a plurality of memory devices into a contiguous data burst. The interface circuit includes a system control signal interface adapted to receive a first command from a memory controller and emulation and command translation logic adapted to translate a first address associated with the first command, issue the first command to a first memory device within the plurality of memory devices corresponding to the first address, and determine that the first command is a read command. The emulation and command translation logic is further adapted to select a memory data signal interface corresponding to the first memory device, receive a first data burst from the first memory device, delay the first data burst to eliminate a first clock-to-data phase between the first memory device and the interface circuit, and re-drive the first data burst to the memory controller.

One advantage of the disclosed interface circuit is that it can provide higher memory performance by not requiring idle bus cycles to turnaround the data bus when switching from reading from one memory device to reading from another memory device, or from writing to one memory device to writing to another memory device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 5A through 5F illustrates a computer platform that includes at least one processing element and at least one memory module, according to various embodiments of the present invention.

DETAILED DESCRIPTION

Figure 1:
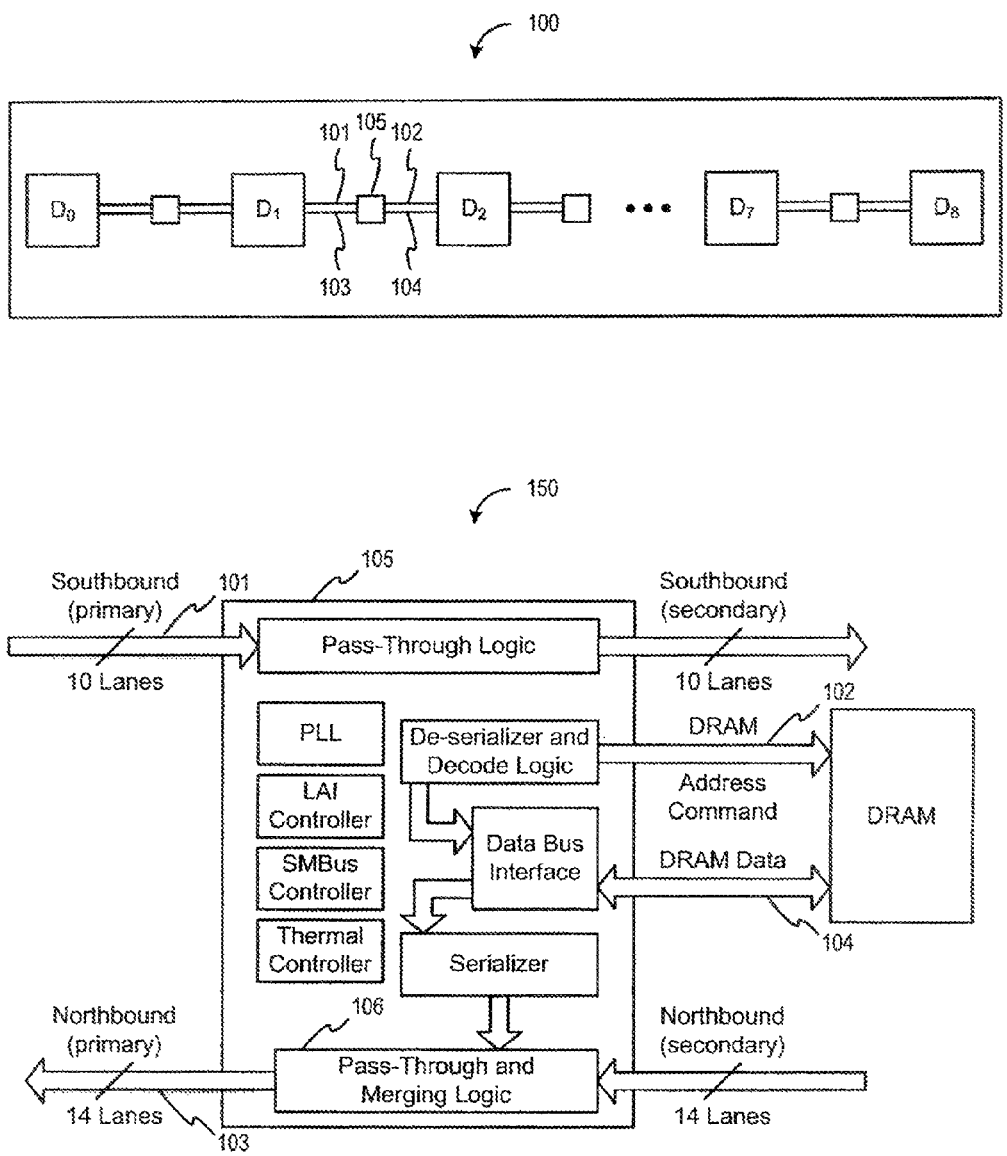
FIG. 1 illustrates an FBDIMM-type memory system, according to prior art.
Figure 2A:
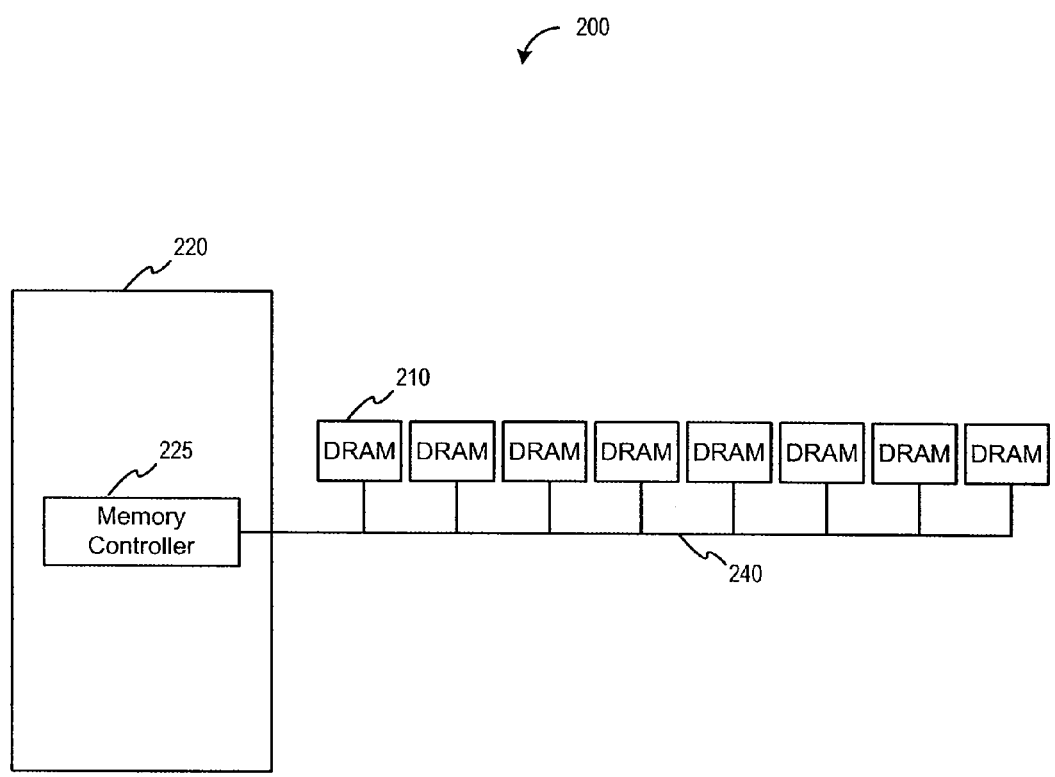
FIG. 2A illustrates major logical components of a computer platform, according to prior art.

FIG. 2A illustrates major logical components of a computer platform 200, according to prior art. As shown, the computer platform 200 includes a system 220 and an array of memory components 210 interconnected via a parallel interface bus 240. As also shown, the system 220 further includes a memory controller 225.

Figure 2B:
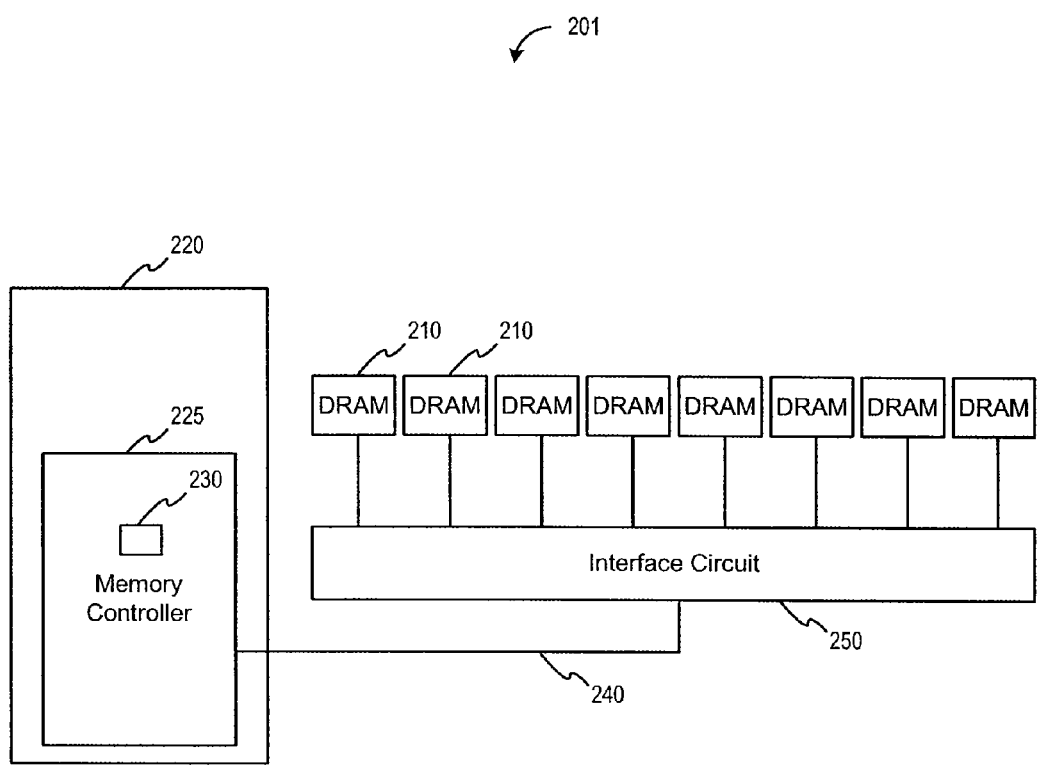
FIG. 2B illustrates major logical components of a computer platform, according to one embodiment of the present invention.

FIG. 2B illustrates major logical components of a computer platform 201, according to one embodiment of the present invention. As shown, the computer platform 201 includes the system 220 (e.g., a processing unit) that further includes the memory controller 225. The computer platform 201 also includes an array of memory components 210 interconnected to an interface circuit 250, which is connected to the system 220 via the parallel interface bus 240. In various embodiments, the memory components 210 may include logical or physical components. In one embodiment, the memory components 210 may include DRAM devices. In such a case, commands from the memory controller 225 that are directed to the DRAM devices respect all of the command-scheduling constraints (e.g. tRRD, tCCD, tFAW, tWTR, etc.). In the embodiment of FIG. 2B, none of the memory components 210 is in direct communication with the memory controller 225. Instead, all communication to/from the memory controller 225 and the memory components 210 is carried out through the interface circuit 250. In other embodiments, only some of the communication to/from the memory controller 225 and the memory components 210 is carried out through the interface circuit 250.

Figure 2C:
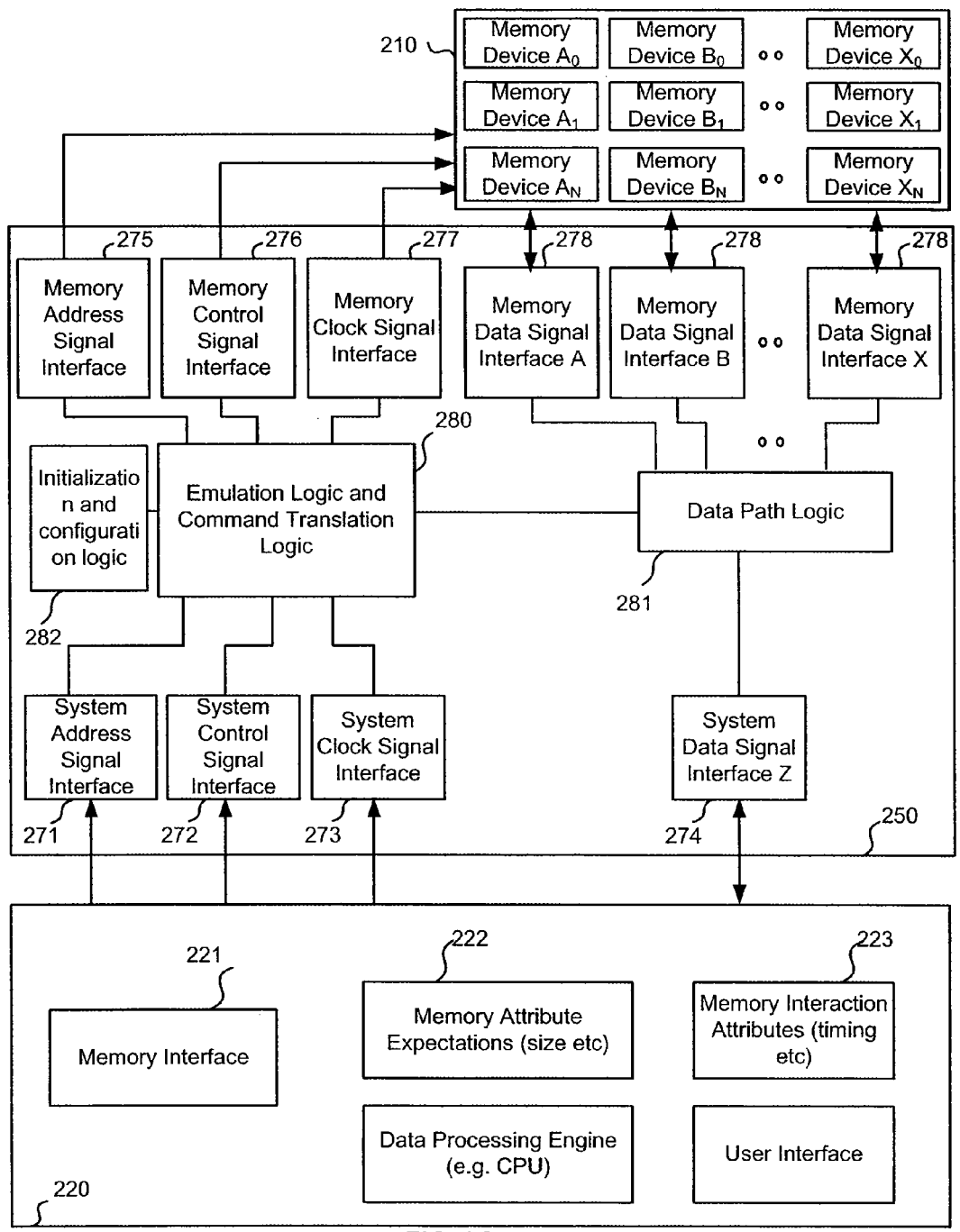
FIG. 2C illustrates a hierarchical view of the major logical components of a computer platform shown in FIG. 2B, according to one embodiment of the present invention.

FIG. 2C illustrates a hierarchical view of the major logical components of the computer platform 201 shown in FIG. 2B, according to one embodiment of the present invention. FIG. 2C depicts the computer platform 201 being comprised of wholly separate components, namely the system 220 (e.g. a motherboard), and the memory components 210 (e.g. logical or physical memory circuits).

In the embodiment shown, the system 220 further comprises a memory interface 221, logic for retrieval and storage of external memory attribute expectations 222, memory interaction attributes 223, a data processing engine 224 (e.g., a CPU), and various mechanisms to facilitate a user interface 225. In various embodiments, the system 220 is designed to the specifics of various standards, in particular the standard defining the interfaces to JEDEC-compliant semiconductor memory (e.g DRAM, SDRAM, DDR2, DDR3, etc.). The specific of these standards address physical interconnection and logical capabilities. In different embodiments, the system 220 may include a system BIOS program capable of interrogating the memory components 210 (e.g. DIMMs) as a way to retrieve and store memory attributes. Further, various external memory embodiments, including JEDEC-compliant DIMMs, include an EEPROM device known as a serial presence detect (SPD) where the DIMM's memory attributes are stored. It is through the interaction of the BIOS with the SPD and the interaction of the BIOS with the physical memory circuits' physical attributes that the memory attribute expectations and memory interaction attributes become known to the system 220.

As also shown, the computer platform 201 includes one or more interface circuits 250 electrically disposed between the system 220 and the memory components 210. The interface circuit 250 further includes several system-facing interfaces, for example, a system address signal interface 271, a system control signal interface 272, a system clock signal interface 273, and a system data signal interface 274. Similarly, the interface circuit 250 includes several memory-facing interfaces, for example, a memory address signal interface 275, a memory control signal interface 276, a memory clock signal interface 277, and a memory data signal interface 278.

In FIG. 2C, the memory data signal interface 278 is specifically illustrated as separate, independent interface. This illustration is specifically designed to demonstrate the functional operation of the seamless burst merging capability of the interface circuit 250, and should not be construed as a limitation on the implementation of the interface circuit. In other embodiments, the memory data signal interface 278 may be composed of more than one independent interfaces. Furthermore, specific implementations of the interface circuit 250 may have a memory address signal interface 275 that is similarly composed of more than one independently operable memory address signal interfaces, and multiple, independent interfaces may exist for each of the signal interfaces included within the interface circuit 250.

An additional characteristic of the interface circuit 250 is the presence of emulation and command translation logic 280, data path logic 281, and initialization and configuration logic 282. The emulation and command translation logic 280 is configured to receive and, optionally, store electrical signals (e.g. logic levels, commands, signals, protocol sequences, communications) from or through the system-facing interfaces, and process those signals. In various embodiments, the emulation and command translation logic 280 may respond to signals from the system-facing interfaces by responding back to the system 220 by presenting signals to the system 220, process those signals with other information previously stored, present signals to the memory components 210, or perform any of the aforementioned operations in any order.

The emulation and command translation logic 280 is capable of adopting a personality, and such personality defines the physical memory component attributes. In various embodiments of the emulation and command translation logic 280, the personality can be set via any combination of bonding options, strapping, programmable strapping, the wiring between the interface circuit 250 and the memory components 210, and actual physical attributes (e.g. value of mode register, value of extended mode register) of the physical memory connected to the interface circuit 250 as determined at some moment when the interface circuit 250 and memory components 210 are powered up.

The data path logic 281 is configured to receive internally generated control and command signals from the emulation and command translation logic 280, and use the signals to direct the flow of data through the interface circuit 250. The data path logic 281 may alter the burst length, burst ordering, data-to-clock phase-relationship, or other attributes of data movement through the interface circuit 250.

The initialization and configuration logic 282 is capable of using internally stored initialization and configuration logic to optionally configure all other logic blocks and signal interfaces in the interface circuit 250. In one embodiment, the emulation and command translation logic 280 is able to receive configuration request from the system control signal interface 272, and configure the emulation and command translation logic 280 to adopt different personalities.

More illustrative information will now be set forth regarding various optional architectures and features of different embodiments with which the foregoing frameworks may or may not be implemented, per the desires of the user. It should be noted that the following information is set forth for illustrative purposes and should not be construed as limiting in any manner. Any of the following features may be optionally incorporated with or without the other features described.

Industry-Standard Operation

In order to discuss specific techniques for inter- and intra-device delays, some discussion of access commands and how they are used is foundational.

Typically, access commands directed to industry-standard memory systems such as DDR2 and DDR3 SDRAM memory systems may be required to respect command-scheduling constraints that limit the available memory bandwidth. Note: the use of DDR2 and DDR3 in this discussion is purely illustrative examples, and is not to be construed as limiting in scope.

In modern DRAM devices, the memory storage cells are arranged into multiple banks, each bank having multiple rows, and each row having multiple columns. The memory storage capacity of the DRAM device is equal to the number of banks times the number of rows per bank times the number of column per row times the number of storage bits per column. In industry-standard DRAM devices (e.g. SDRAM, DDR, DDR2, DDR3, and DDR4 SDRAM, GDDR2, GDDR3 and GDDR4 SGRAM, etc.), the number of banks per device, the number of rows per bank, the number of columns per row, and the column sizes are determined by a standards-setting organization such as JEDEC. For example, the JEDEC standards require that a 1 Gb DDR2 or DDR3 SDRAM device with a four-bit wide data bus have eight banks per device, 8192 rows per bank, 2048 columns per row, and four bits per column. Similarly, a 2 Gb device with a four-bit wide data bus must have eight banks per device, 16384 rows per bank, 2048 columns per row, and four bits per column. A 4 Gb device with four-bit wide data bus must have eight banks per device, 32768 rows per bank, 2048 columns per row, and four bits per column. In the 1 Gb, 2 Gb and 4 Gb devices, the row size is constant, and the number of rows doubles with each doubling of device capacity. Thus, a 2 Gb or a 4 Gb device may be emulated by using multiple 1 Gb and 2 Gb devices, and by directly translating row-activation commands to row-activation commands and column-access commands to column-access commands. This emulation is possible because the 1 Gb, 2 Gb, and 4 Gb devices all have the same row size.

The JEDEC standards require that an 8 Gb device with a four-bit wide data bus interface must have eight banks per device, 32768 rows per bank, 4096 columns per row, and four bits per column—thus doubling the row size of the 4 Gb device. Consequently, an 8 Gb device cannot necessarily be emulated by using multiple 1 Gb, 2 Gb or 4 Gb devices and simply translating row-activation commands to row-activation commands and column-access commands to column-access commands.

Now, with an understanding of how access commands are used, presented as follows are various additional optional techniques that may optionally be employed in different embodiments to address various possible issues.

Figure 3A:
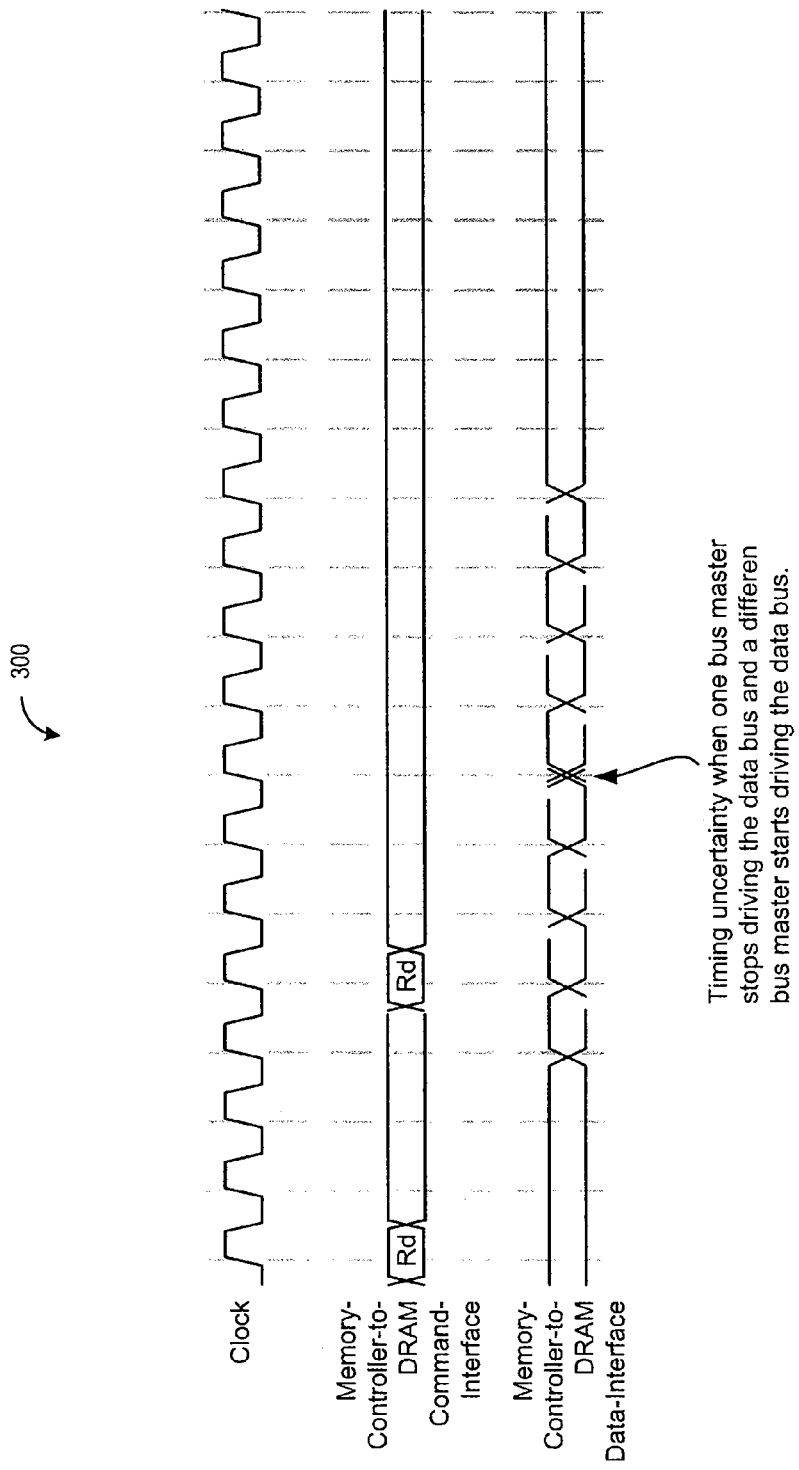
FIG. 3A illustrates a timing diagram for multiple memory devices in a low data rate memory system, according to prior art.

FIG. 3A illustrates a timing diagram for multiple memory devices (e.g., SDRAM devices) in a low data rate memory system, according to prior art. FIG. 3A illustrates that multiple SDRAM devices in a low data rate memory system can share the data bus without needing idle cycles between data bursts. That is, in a low data rate system, the inter-device delays involved are small relative to a clock cycle. Therefore, multiple devices may share the same bus and even though there may be some timing uncertainty when one device stops being the bus master and another device becomes the bus master, the data cycle is not delayed or corrupted. This scheme using time division access to the bus has been shown to work for time multiplexed bus masters in a low data rate memory systems—without the requirement to include idle cycles to switch between the different bus masters.

Figure 3B:
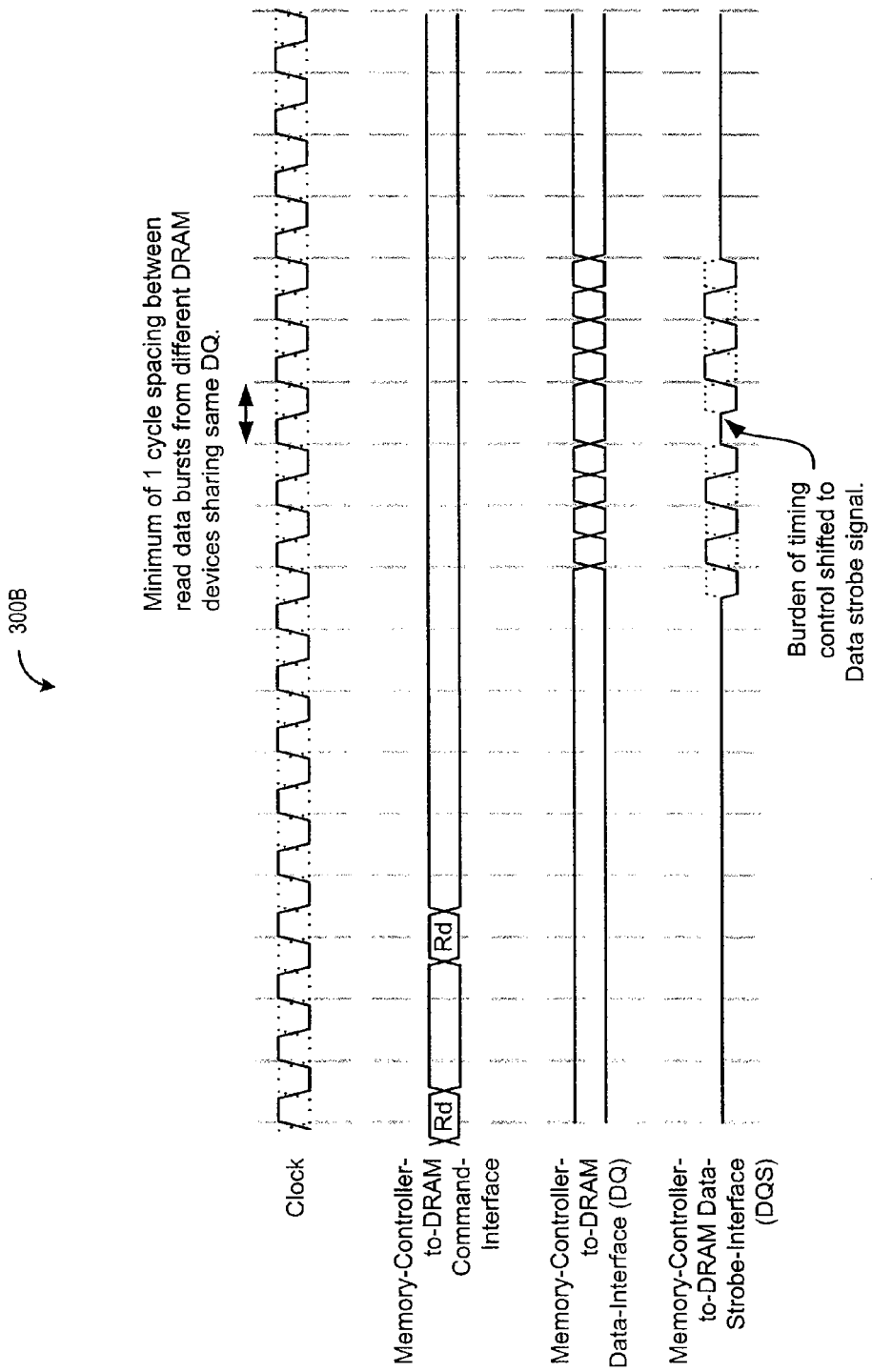
FIG. 3B illustrates a timing diagram for multiple memory devices in a higher data rate memory system, according to prior art.

As the speed of the clock increases, the inter- and intra-device delays comprise successively more and more of a clock cycle (as a ratio). At some point, the inter- and intra-device delays are sufficiently large (relative to a clock cycle) that the multiple devices on a shared bus must be managed. In particular, and as shown in FIG. 3B, as the speed of the clock increases, the inter- and intra-device delays comprise successively more and more of a clock cycle (as a ratio). Consequently, a one cycle delay is needed between the end of a read data burst of a first device on a shared device and the beginning of a read data burst of a second device on the same bus. FIG. 3B illustrates that, at the clock rate shown, multiple memory devices (e.g., DDR SDRAM, DDR2 SDRAM, DDR3 SDRAM devices) sharing the data bus must necessarily incur minimally a one cycle penalty when switching from one memory device driving the data bus to another memory device driving the data bus.

Figure 3C:
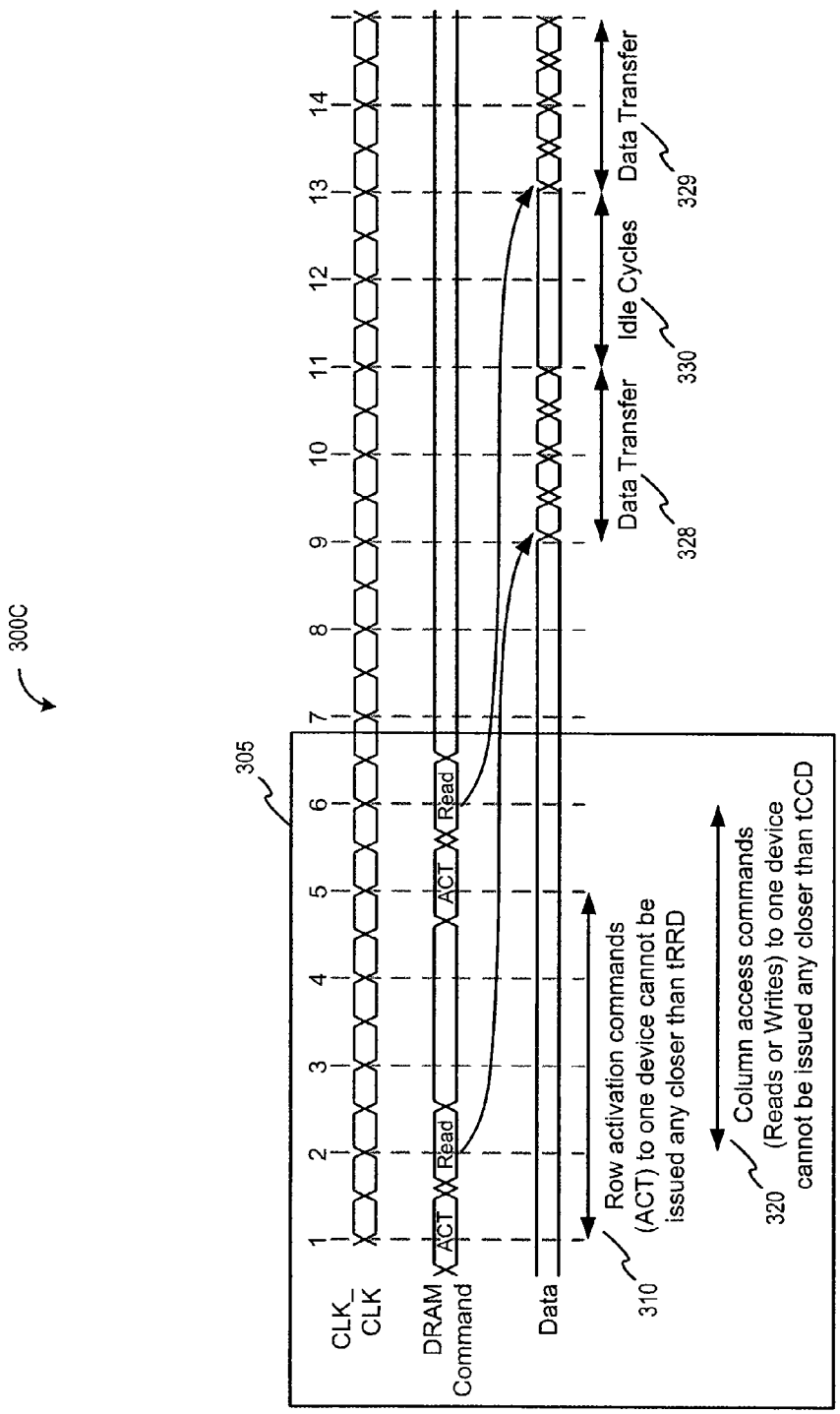
FIG. 3C illustrates a timing diagram for multiple memory devices in a high data rate memory system, according to prior art.

FIG. 3C illustrates a timing diagram for multiple memory devices in a high data rate memory system, according to prior art. FIG. 3C shows command cycles, timing constraints 310 and 320, and idle cycles of memory. As the clock rate further increases, the inter- and intra-device delay may become as long as one or more clock cycles. In such a case, switching between a first memory device and a second memory device would introduce one or more idle cycles 330. Embodiments of the invention herein might be advantageously applied to reduce or eliminate idle time 330 between the data transfers 328 and 329.

Continuing the discussion of FIG. 3C, the timing diagram shows a limitation preventing full bandwidth utilization in a DDR3 SDRAM memory system. For example, in an embodiment involving DDR3 SDRAM memory systems, any two row-access commands directed to a single DRAM device may not necessarily be scheduled closer than a period of time defined by the timing parameter of tRRD. As another example, at most four row-access commands may be scheduled within a period of time defined by the timing parameter of tFAW to a single DRAM device. Moreover, consecutive column-read access commands and consecutive column-write access commands cannot necessarily be scheduled to a given DRAM device any closer than tCCD, where tCCD equals four cycles (eight half-cycles of data) in DDR3 DRAM devices. This situation is shown in the left portion of the timing diagram of FIG. 3C at 305. Row-access or row-activation commands are shown as ACT in the figures. Column-access commands are shown as READ or WRITE in the figures. Thus, for example, in memory systems that require a data access in a data burst of four half-cycles as shown in FIG. 3C, the tCCD constraint prevents column accesses from being scheduled consecutively. FIG. 3C shows that the constraints 310 and 320 imposed on the DRAM commands sent to a given device restrict the command rate, resulting in idle cycles or bubbles 330 on the data bus and reducing the bandwidth. Again, embodiments of the invention herein might be advantageously applied to reduce or eliminate idle time 330 between the data transfers 328 and 329.

As illustrated in FIGS. 3A-3C, idle-cycle-less data bus switching was possible with slower speed DRAM memory systems such as SDRAM memory systems, but not possible with higher speed DRAM memory systems such as DDR SDRAM, DDR2 SDRAM, DDR3 SDRAM devices due to the fact that in any memory system where multiple memory devices share the same data bus, the skew and jitter characteristics of address, clock, and data signals introduce timing uncertainties into the access protocol of the memory system. In the case when the memory controller wishes to stop accessing one memory device to switch to accessing a different device, the differences in address, clock and data signal skew and jitter characteristics of the two difference memory devices reduce the amount of time that the memory controller can use to reliably capture data. In the case of the slow-speed SDRAM memory system, the SDRAM memory system is designed to operate at speeds no higher than 200 MHz, and data bus cycle times are longer than 5 nanoseconds (ns). Consequently, timing uncertainties introduced by inter-device skew and jitter characteristics may be tolerated as long as they are sufficiently smaller than the cycle time of the memory system—for example, 1 ns. However, in the case of higher speed memory systems, where data bus cycles times are comparable in duration to, or shorter than, one-nanosecond, a one-nanosecond uncertainty in skew or jitter between signal timing from different devices means that memory controllers can no longer reliably capture data from different devices without accounting for the inter-device skew and jitter characteristics.

As illustrated in FIG. 3B, DDR SDRAM, DDR2 and DDR3 SDRAM memory systems use the DQS signal to provide a source-synchronous timing reference between the DRAM devices and the memory controller. The use of the DQS signal provides accurate timing control at the cost of idle cycles that must be incurred when a first bus master (DRAM device) stops driving the DQS signal, and a second bus master (DRAM device) starts to drive the DQS signal for at least one cycle before the second bus master places the data burst on the shared data bus. The placement of multiple DRAM devices on the same shared data bus is a desirable configuration from the perspective of enabling a higher capacity memory system and providing a higher degree of parallelism to the memory controller. However, the required use of the DQS signal significantly lowers the sustainable bandwidth of the memory system.

The advantage of the infrastructure-compatible burst merging interface circuit 250 illustrated in FIGS. 2B and 2C and described in greater detail below is that it can provide the higher capacity, higher parallelism that the memory controller desires while retaining the use of the DQS signal in an infrastructure-compatible system to provide the accurate timing reference for data transmission that is critical for modern memory systems, without the cost of the idle cycles required for the multiple bus masters (DRAM devices) to switch from one DRAM device to another.

Elimination of Idle Data-Bus Cycles Using an Interface Circuit

Figure 4A:
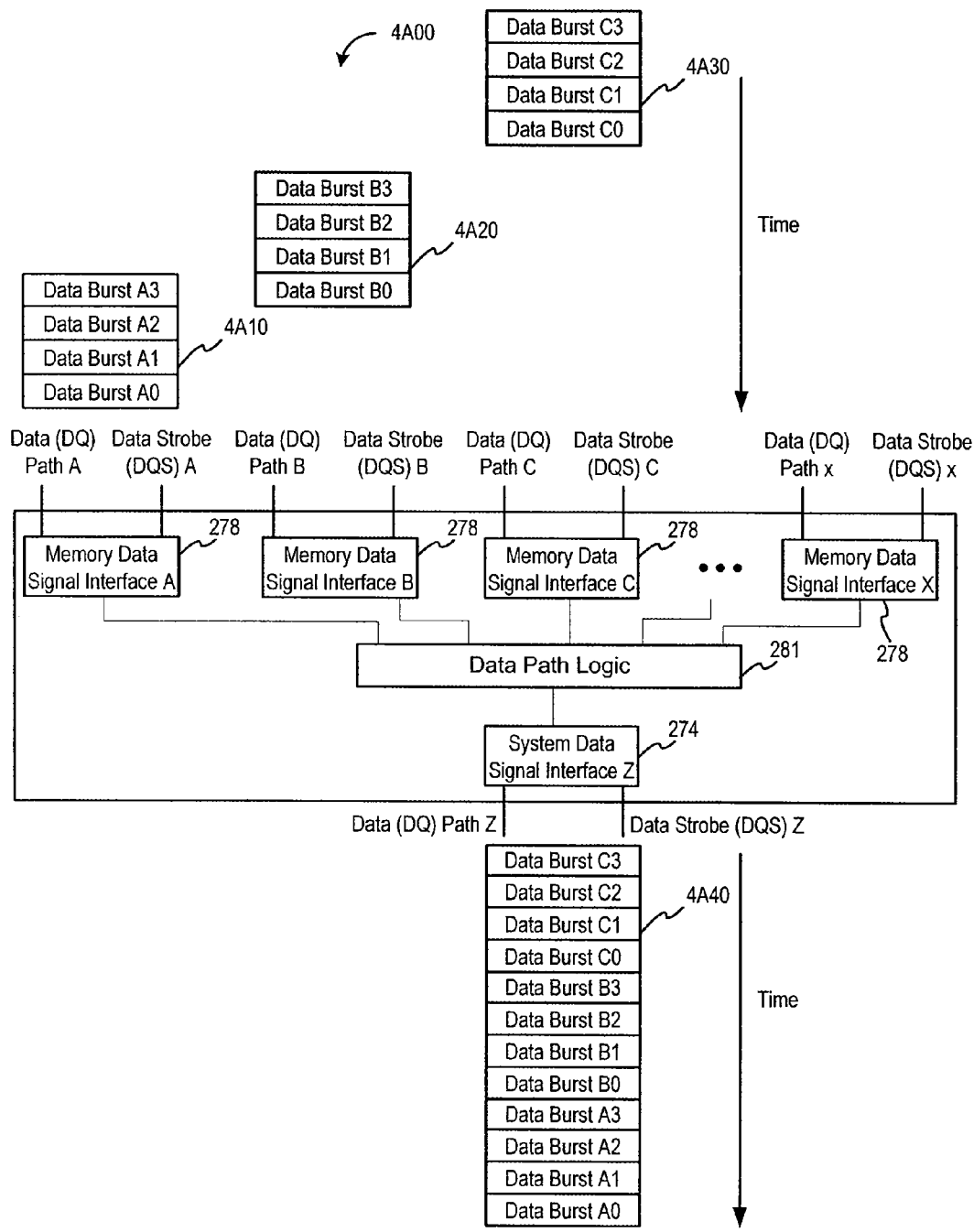
FIG. 4A illustrates a data flow diagram showing how time separated bursts are combined into a larger contiguous burst, according to one embodiment of the present invention.

FIG. 4A illustrates a data flow diagram through the data signal interfaces 278, Data Path Logic 281 and System Data Signal Interface 274 of FIG. 2C, showing how data bursts returned by multiple memory devices in response to multiple, independent read commands to different memory devices connected respectively to Data Path A, synchronized by Data Strobe A, Data Path B, synchronized by Data Strobe B, and Data Path C, synchronized by Data Strobe C are combined into a larger contiguous burst, according to one embodiment of the present invention. In particular, data burst B (B0, B1, B2, B3) 4A20 is slightly overlapping with data burst A (A0, A1, A2, A3) 4A10. Also, data burst C 4A30 does not overlap with either the data burst A 410, nor the data burst B 4A20. As described in greater detail in FIGS. 4C and 4D, various logic components of the interface circuit 250 illustrated in FIG. 2C are configured to re-time overlapping or non-overlapping bursts to obtain contiguous burst of data 4A40. In various embodiments, the logic required to implement the ordering and concatenation of overlapping or non-overlapping bursts may be implemented using registers, multiplexors, and combinational logic. As shown in FIG. 4A, the assembled, contiguous burst of data 4A40 is indeed contiguous and properly ordered.

FIG. 4A shows that the data returned by the memory devices can have different phase relationships relative to the clock signal of the interface circuit 250. FIG. 4D shows how the interface circuit 250 may use the knowledge of the independent clock-to-data phase relationships to delay each data burst to the interface circuit 250 to the same clock domain, and re-drive the data bursts to the system interface as one single, contiguous, burst.

Figure 4B:
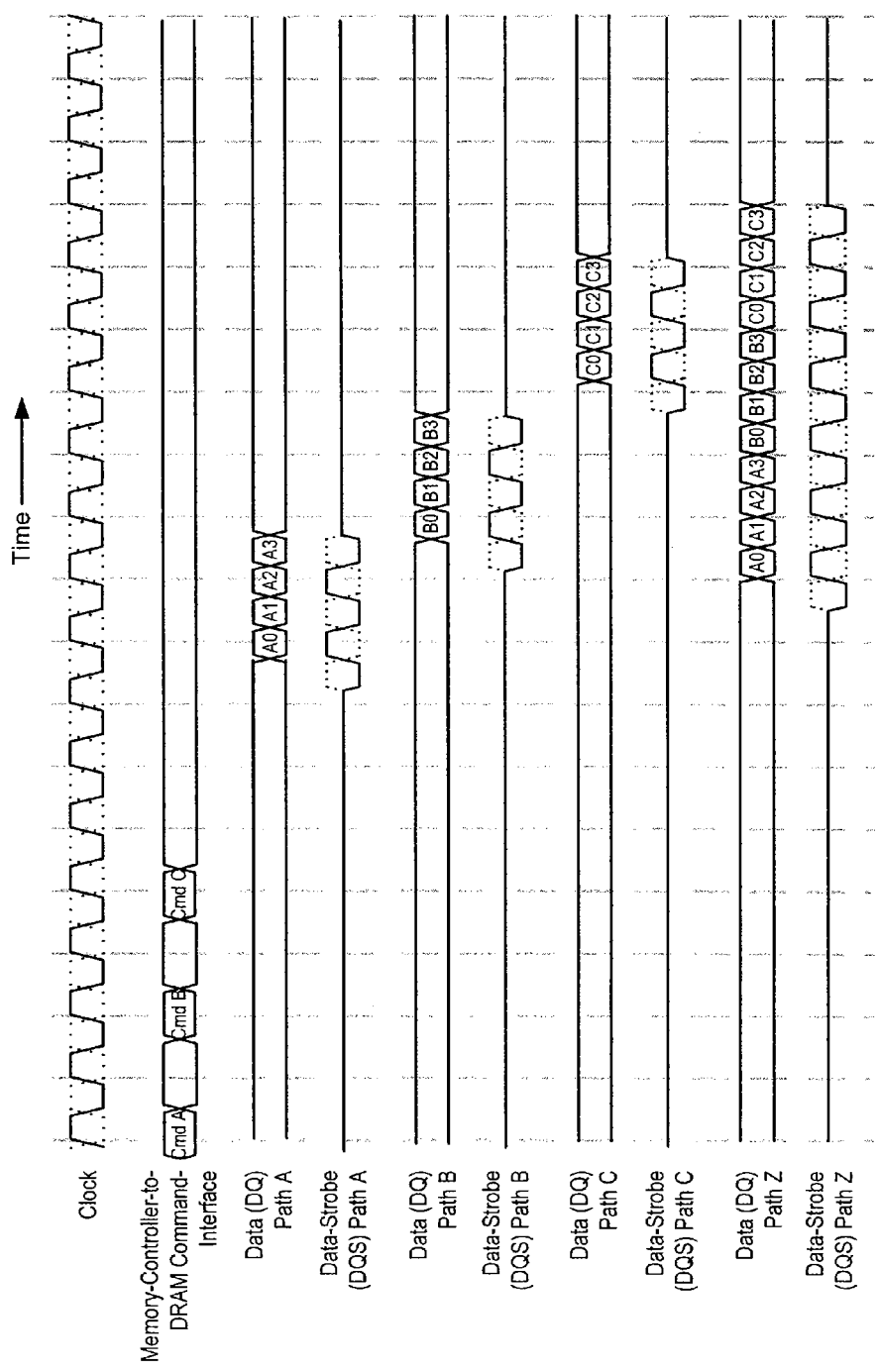
FIG. 4B illustrates a waveform corresponding to FIG. 4A showing how time separated bursts are combined into a larger contiguous burst, according to one embodiment of the present invention.

FIG. 4B illustrates a waveform corresponding to FIG. 4A showing how the three time separated bursts from three different memory devices are combined into a larger contiguous burst, according to one embodiment of the present invention. FIG. 4B shows that, as viewed from the perspective of the interface circuit 250, the data burst A0-A1-A2-A3, arriving from one of the memory components 210 to memory data signal interface A as a response to command (Cmd) A issued by the memory controller 225, can have a data-to-clock relationship that is different from data burst B0-B1-B2-B3, arriving at memory signal interface B, and a data burst C0-C1-C2-C3 can have yet a third clock-to-data timing relationship with respect to the clock signal of the interface circuit 250. FIG. 4B shows that once the respective data bursts are re-synchronized to the clocking domain of the interface circuit 250, the different data bursts can be driven out of the system data interface Z as a contiguous data burst.

Figure 4C:
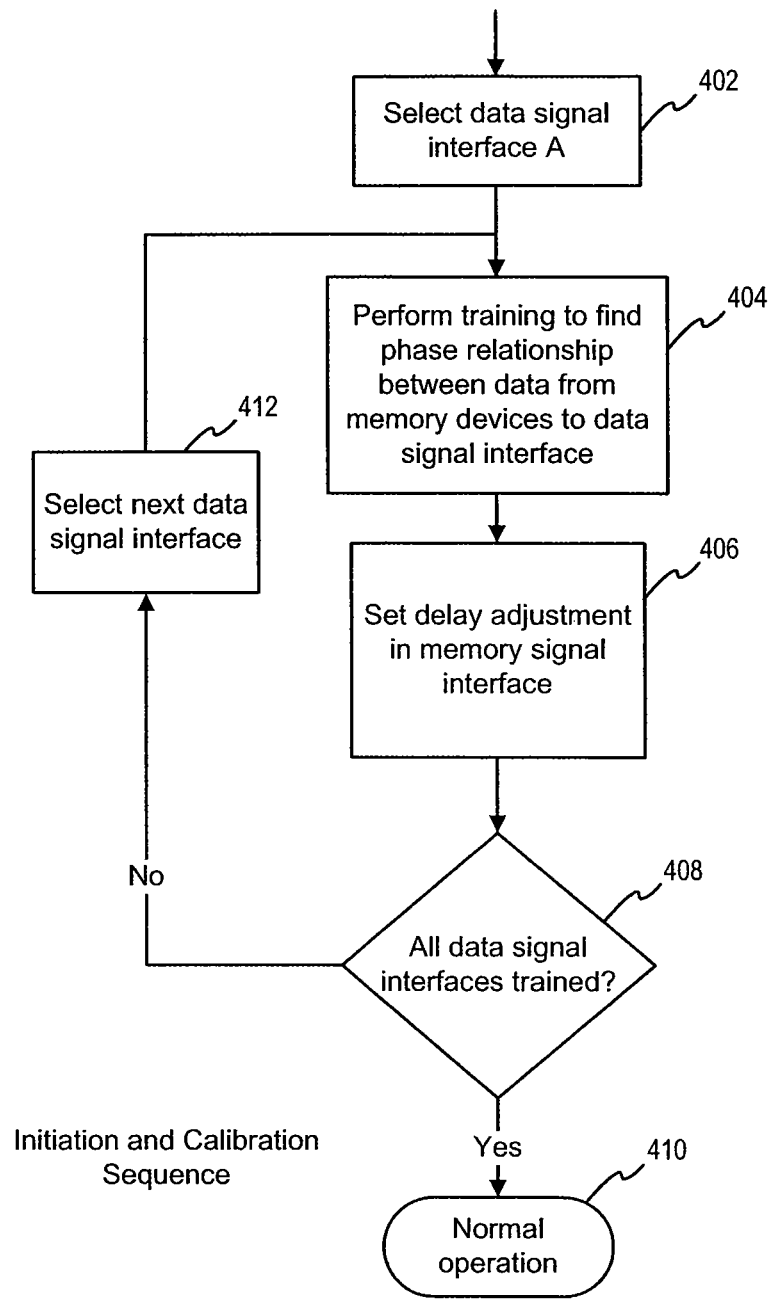
FIG. 4C illustrates a flow diagram of method steps showing how the interface circuit can optionally make use of a training or clock-to-data phase calibration sequence to independently track the clock-to-data phase relationship between the memory components and the interface circuit, according to one embodiment of the present invention.
Figure 4D:
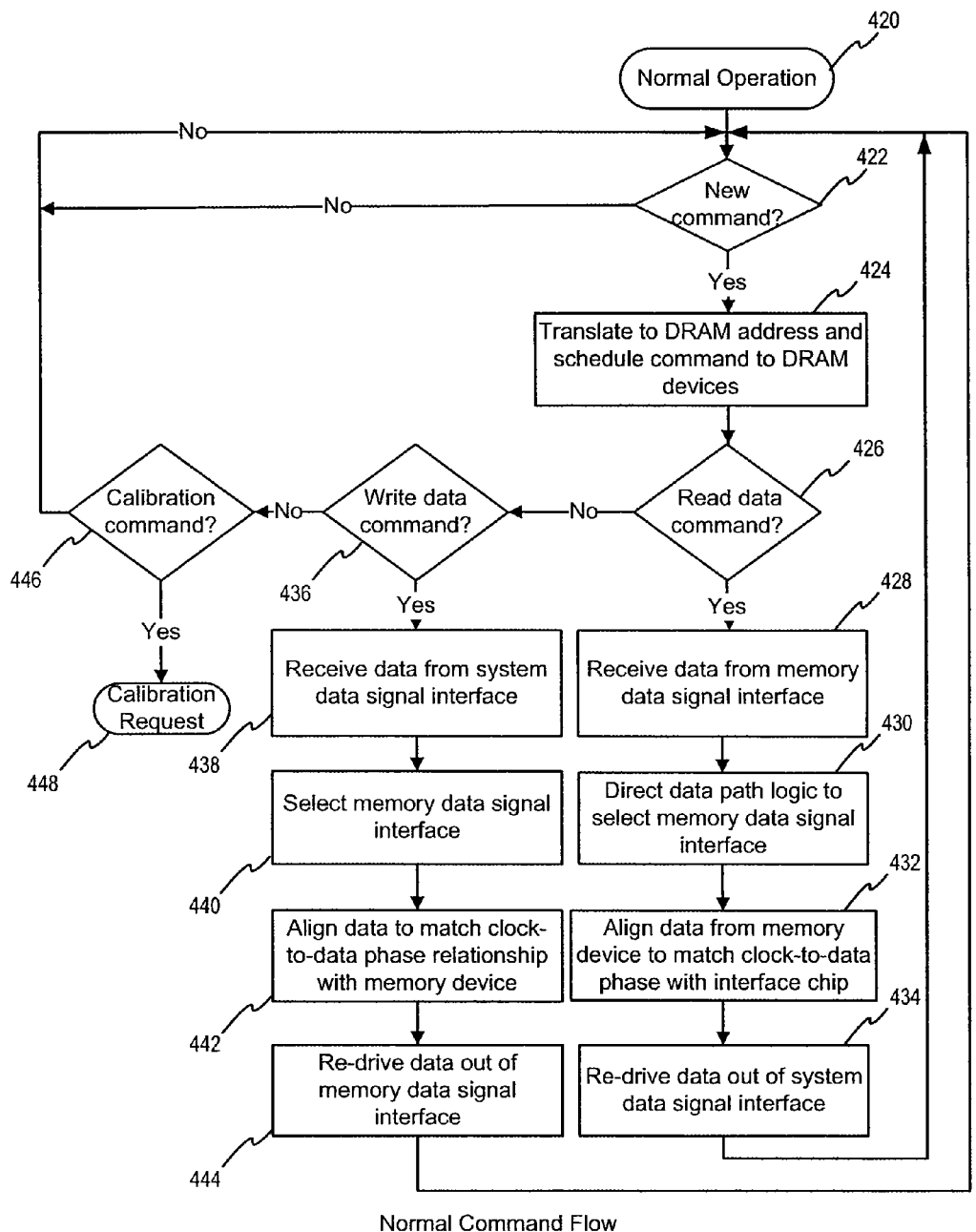
FIG. 4D illustrates a flow diagram showing the operations of the interface circuit in response to the various commands, according to one embodiment of the present invention.

FIG. 4C illustrates a flow diagram of method steps showing how the interface circuit 250 can optionally make use of a training or clock-to-data phase calibration sequence to independently track the clock-to-data phase relationship between the memory components 210 and the interface circuit 250, according to one embodiment of the present invention. In implementations where the clock-to-data phase relationships are static, the training or calibration sequence is not needed to set the respective delays in the memory data signal interfaces. While the method steps are described with relation to the computer platform 201 illustrated in FIGS. 2B and 2C, any system performing the method steps, in any order, is within the scope of the present invention.

The training or calibration sequence is typically performed after the initialization and configuration logic 282 receives either an interface circuit initialization or calibration request. The goal of the training or calibration sequence is to establish the clock-to-data phase relationship between the data from a given memory device among the memory components 210 and a given memory data signal interface 278. The method begins in step 402, where the initialization and configuration logic 282 selects one of the memory data signal interfaces 278. As shown in FIG. 4C, memory data signal interface A may be selected. Then, the initialization and configuration logic 282 may, optionally, issue one or more commands through the memory control signal interface 276 and optionally, memory address signal interface 275, to one or more of the memory components 210 connected to memory data signal interface A. The commands issued through the memory controller signal interface 276 and optionally, memory address signal interface 275, will have the effect of getting the memory components 210 to receive or return previously received data in a predictable pattern, sequence, and timing so that the interface circuit 250 can determine the clock-to-data phase relationships between the memory device and the specific memory data signal interface. In specific DRAM memory systems such as DDR2 and DDR3 SDRAM memory systems, multiple clocking relationships must all be tracked, including clock-to-data and clock-to-DQS. For the purposes of this application, the clock-to-data phase relationship is taken to encompass all clocking relationships on a specific memory data interface, including and not limited to clock-to-data and clock-to-DQS.

In step 404, the initialization and configuration logic 282 performs training to determine clock-to-data phase relationship between the memory data interface A and data from memory components 210 connected to the memory data interface A. In step 406, the initialization and configuration logic 282 directs the memory data interface A to set the respective delay adjustments so that clock-to-data phase variances of each of the memory components 210 connected to the memory data interface A can be eliminated. In step 408, the initialization and configuration logic 282 determines whether all memory data signal interfaces 278 within the interface circuit 250 have been calibrated. If so, the method ends in step 410 with the interface circuit 250 entering normal operation regime. If, however, the initialization and configuration logic 282 determines that not all memory data signal interfaces 278 have been calibrated, then in step 412, the initialization and configuration logic 282 selects a memory data signal interface that has not yet been calibrated. The method then proceeds to step 402, described above.

The flow diagram of FIG. 4C shows that the memory data signal interfaces 278 are trained sequentially, and after memory data interface A has been trained, memory data interface B is similarly trained, and respective delays set for data interface B. The process is then repeated until all of the memory data signal interfaces 278 have been trained and respective delays are set. In other embodiments, the respective memory data signal interfaces 278 may be trained in parallel. After the calibration sequence is complete, control returns to the normal flow diagram as illustrated in FIG. 4D.

FIG. 4D illustrates a flow diagram of method steps showing the operations of the interface circuit 250 in response to the various commands, according to one embodiment of the present invention. While the method steps are described with relation to the computer platform 201 illustrated in FIGS. 2B and 2C, any system performing the method steps, in any order, is within the scope of the present invention.

The method begins in step 420, where the interface circuit 250 enters normal operation regime. In step 422, the system control signal interface 272 determines whether a new command has been received from the memory controller 225. If so, then, in step 424, the emulation and command translation logic 280 translates the address and issues the command to one or more memory components 210 through the memory address signal interface 275 and the memory control signal interface 276. Otherwise, the system control signal interface 272 waits for the new command (i.e., the method returns to step 422, described above).

In the general case, the emulation and command translation logic 280 may perform a series of complex actions to handle different commands. However, the description of all commands are not vital to the enablement of the seamless burst merging functionality of the interface circuit 250, and the flow diagram in FIG. 4D describes only those commands that are vital to the enablement of the seamless burst merging functionality. Specifically, the READ command, the WRITE command and the CALIBRATION command are important commands for the seamless burst merging functionality.

In step 426, the emulation and command translation logic 280 determines whether the new command is a READ command. If so, then the method proceeds to step 428, where the emulation and command translation logic 280 receives data from the memory component 210 via the memory data signal interface 278. In step 430, the emulation and command translation logic 280 directs the data path logic 281 to select the memory data signal interface 278 that corresponds to one of the memory components 210 that the READ command was issued to. In step 432, the emulation and command translation logic 280 aligns the data received from the memory component 210 to match the clock-to-data phase with the interface circuit 250. In step 434, the emulation and command translation logic 280 directs the data path logic 281 to move the data from the selected memory data signal interface 278 to the system data signal interface 274 and re-drives the data out of the system data signal interface 274. The method then returns to step 422, described above.

If, however, in step 426, the emulation and command translation logic determines that the new command is not a READ command, the method then proceeds to step 436, where the emulation and command translation logic determines whether the new command is a WRITE command. If so, then, in step 438, the emulation and command translation logic 280 directs the data path logic 281 to receive data from the memory controller 225 via the system data signal interface 274. In step 440, the emulation and command translation logic 280 selects the memory data signal interface 278 that corresponds to the memory component 210 that is the target of the WRITE commands and directs the data path logic 281 to move the data from the system data signal interface 274 to the selected memory data signal interface 278. In step 442, the selected memory data signal interface 278 aligns the data from system data signal interface 274 to match the clock-to-data phase relationship of the data with the target memory component 210. In step 444, the memory data signal interface 278 re-drives the data out to the memory component 210. The method then returns to step 422, described above.

If, however, in step 436, the emulation and command translation logic determines that the new command is not a WRITE command, the method then proceeds to step 446, where the emulation and command translation logic determines whether the new command is a CALIBRATION command. If so, then the method ends at step 448, where the emulation and command translation logic 280 issues a calibration request to the initialization and configuration logic 282. The calibration sequence has been described in FIG. 4C.

The flow diagram in FIG. 4D illustrates the functionality of the burst merging interface circuit 250 for individual commands. As an example, FIG. 4A illustrates the functionality of the burst merging interface circuit for the case of three consecutive read commands. FIG. 4A shows that data bursts A0, A1, A2 and A3 may be received by Data Path A, data bursts B0, B1, B2 and B3 may be received by Data Path B, and data bursts C0, C1, C2 and C3 may be received by Data Path C, wherein the respective data bursts may all have different clock-to-data phase relationships and in fact pat of the data bursts may overlap in time. However, through the mechanism illustrated in the flow diagram contained in FIG. 4D, data bursts from Data Paths A, B, and C are all phase aligned to the clock signal of the interface circuit 250 before they are driven out of the system data signal interface 274 and appear as a single contiguous data burst with no idle cycles necessary between the bursts. FIG. 4B shows that once the different data bursts from different memory circuits are time aligned to the same clock signal used by the interface circuit 250, the memory controller 225 can issue commands with minimum spacing—constrained only by the full utilization of the data bus—and the seamless burst merging functionality occur as a natural by-product of the clock-to-data phase alignment of data from the individual memory components 210 connected via parallel data paths to interface circuit 250.

Figure 5A:
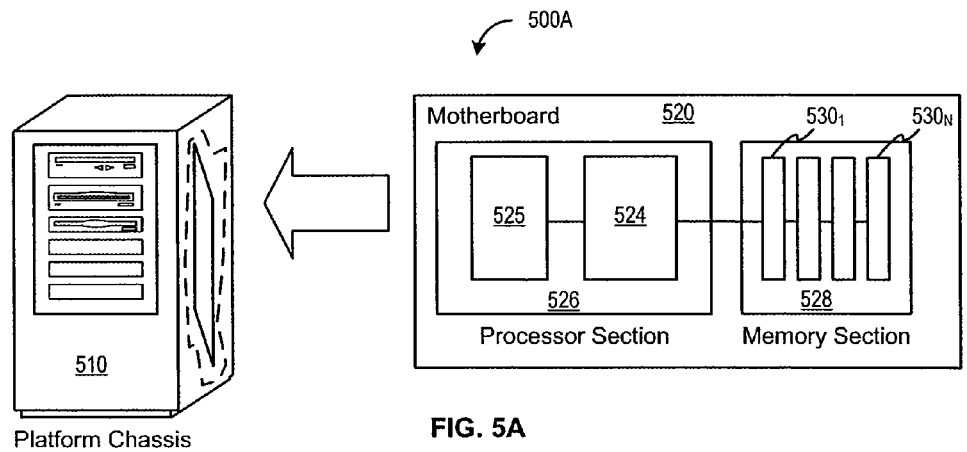

FIG. 5A illustrates a compute platform 500A that includes a platform chassis 510, and at least one processing element that consists of or contains one or more boards, including at least one motherboard 520. Of course the platform 500 as shown might comprise a single case and a single power supply and a single motherboard. However, it might also be implemented in other combinations where a single enclosure hosts a plurality of power supplies and a plurality of motherboards or blades.

The motherboard 520 in turn might be organized into several partitions, including one or more processor sections 526 consisting of one or more processors 525 and one or more memory controllers 524, and one or more memory sections 528. Of course, as is known in the art, the notion of any of the aforementioned sections is purely a logical partitioning, and the physical devices corresponding to any logical function or group of logical functions might be implemented fully within a single logical boundary, or one or more physical devices for implementing a particular logical function might span one or more logical partitions. For example, the function of the memory controller 524 might be implemented in one or more of the physical devices associated with the processor section 526, or it might be implemented in one or more of the physical devices associated with the memory section 528.

Figure 5B:
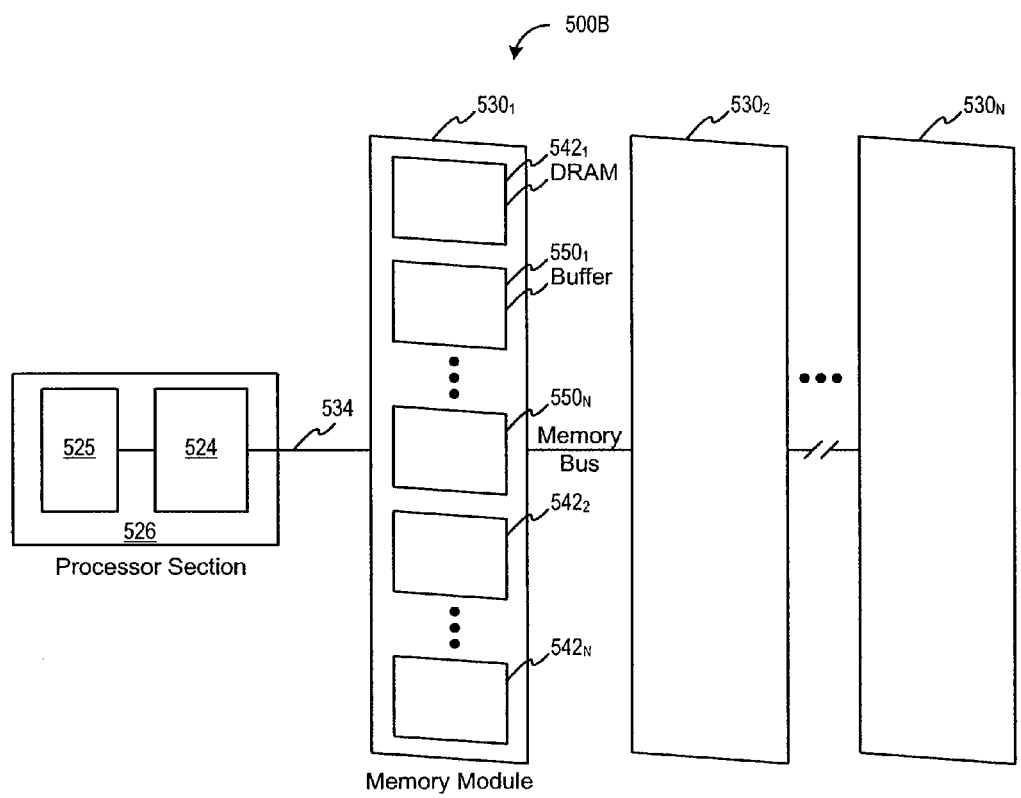

FIG. 5B illustrates one exemplary embodiment of a memory section, such as, for example, the memory section 528, in communication with a processor section 526. In particular, FIG. 5B depicts embodiments of the invention as is possible in the context of the various physical partitions on structure 520. As shown, one or more memory modules $530_1$-$530_N$ each contain one or more interface circuits $550_1$-$550_N$ and one or more DRAMs $542_1$-$542_N$ positioned on (or within) a memory module $530_1$.

It must be emphasized that although the memory is labeled variously in the figures (e.g. memory, memory components, DRAM, etc), the memory may take any form including, but not limited to, DRAM, synchronous DRAM (SDRAM), double data rate synchronous DRAM (DDR SDRAM, DDR2 SDRAM, DDR3 SDRAM, etc.), graphics double data rate synchronous DRAM (GDDR SDRAM, GDDR2 SDRAM, GDDR3 SDRAM, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), phase-change memory, flash memory, and/or any other type of volatile or non-volatile memory.

Many other partition boundaries are possible and contemplated, including positioning one or more interface circuits 550 between a processor section 526 and a memory module 530 (see FIG. 5C), or implementing the function of the one or more interface circuits 550 within the memory controller 524 (see FIG. 5D), or positioning one or more interface circuits 550 in a one-to-one relationship with the DRAMs $542_1$-$542_N$ and a memory module 530 (see 5E), or implementing the one or more interface circuits 550 within a processor section 526 or even within a processor 525 (see FIG. 5F). Furthermore, the system 220 illustrated in FIGS. 2B and 2C is analogous to the computer platform 500 and 510 illustrated in FIGS. 5A-5F, the memory controller 225 illustrated in FIGS. 2B and 2C is analogous to the memory controller 524 illustrated in FIGS. 5A-5F, the interface circuit 250 illustrated in FIGS. 2B and 2C is analogous to the interface circuits 550 illustrated in FIGS. 5A-5F, and the memory components 210 illustrated in FIGS. 2B and 2C are analogous to the DRAMs 542 illustrated in FIGS. 5A-5F. Therefore, all discussions of FIGS. 2B, 2C, and 4A-4D apply with equal force to the systems illustrated in FIGS. 5A-5F.

One advantage of the disclosed interface circuit is that the idle cycles required to switch from one memory device to another memory device may be eliminated while still maintaining accurate timing reference for data transmission. As a result, memory system bandwidth may be increased, relative to the prior art approaches, without changes to the system interface or commands.

While the foregoing is directed to embodiments of the present invention, other and further embodiments of the invention may be devised without departing from the basic scope thereof. Therefore, the scope of the present invention is determined by the claims that follow.

We claim:

1. A sub-system comprising:
    a plurality of memory devices comprising a first memory device, wherein a timing for a data burst from each of the plurality of memory devices is provided by a respective, different, data strobe (DQS) signal;
    an interface circuit comprising:
    a plurality of memory data signal interfaces comprising a first memory data signal interface, a number of the plurality of memory data signal interfaces being equal to a number of the plurality of memory devices, each memory data signal interface including a respective data (DQ) path and a respective data strobe (DQS) path coupled to a corresponding memory device of the plurality of memory devices, wherein the first memory data signal interface is coupled to the first memory device;

a system control signal interface coupled to a memory controller, the system control signal interface configured to receive a first read command from the memory controller;

emulation and command translation logic configured to:
 select the first memory data signal interface based on the first read command;
 receive a first data burst from the first memory data signal interface, wherein a timing reference for the first data burst is provided by a DQS signal of the first memory device;
 delay the first data burst to align a phase difference between the DQS signal of the first memory device and a clock signal of the interface circuit; and
 transmit the delayed first data burst to the memory controller; and initialization and configuration logic configured to:
 select the first memory data signal interface;
 issue a calibration read command, via the first memory data signal interface, to read test data stored at the first memory device;
 receive the test data from the first memory device across the first memory data signal interface;
 determine the phase difference between the DQS signal of the first memory device and the clock signal based on a timing of the received test data; and
 set a delay within the first memory data signal interface corresponding to the first memory device.

2. The sub-system of claim 1, wherein
the plurality of memory devices further comprises a second memory device,
the plurality of memory data signal interfaces further comprises a second memory data signal interface,
the system control signal interface is further configured to receive a second read command from the memory controller, and
the emulation and command translation logic is further configured to:
 select the second memory data signal interface based on the second read command;
 receive a second data burst from the second memory data signal interface, wherein a timing of the second data burst is provided by a DQS signal of the second memory device;
 delay the second data burst to align a phase difference between the DQS signal of the second memory device and the clock signal;
 combine the delayed first data burst and the delayed second data burst into a contiguous data burst; and
 transmit the contiguous data burst to the memory controller.

3. The sub-system of claim 2, wherein the emulation and command translation logic is further configured to:
 emulate a virtual memory device using at least the first memory device and the second memory device, wherein a memory capacity of the virtual memory device is equal to a combined memory capacity of the first memory device and the second memory device; and
 present the virtual memory device to the memory controller.

4. The sub-system of claim 1, wherein selecting the first memory data signal interface further comprises receiving a calibration request and selecting the first memory data signal interface in response to the received calibration request.

5. The sub-system of claim 1, wherein the interface circuit further comprises data path logic, and wherein the data path logic is configured to concatenate two or more data bursts to eliminate an inter-device command scheduling constraint between the two or more data bursts.

6. The sub-system of claim 5, wherein the inter-device command scheduling constraint includes a rank-to-rank data bus turnaround time or an on-die-termination (ODT) control switching time.

7. An interface circuit comprising:
a plurality of memory data signal interfaces comprising a first memory data signal interface, each memory data signal interface including a respective data (DQ) path and a respective data strobe (DQS) path coupled to a respective, different, memory device;
a system control signal interface coupled to a memory controller, the system control signal interface configured to receive a first read command from the memory controller;
emulation and command translation logic configured to:
 select the first memory data signal interface based on the first read command;
 receive a first data burst from the first memory data signal interface, wherein a timing reference for the first data burst is provided by a DQS signal of a memory device coupled to the first memory data signal interface;
 delay the first data burst to align a phase difference between the DQS signal of the memory device and a clock signal of the interface circuit; and
 transmit the delayed first data burst to the memory controller; and
initialization and configuration logic configured to:
 select the first memory data signal interface;
 issue a calibration read command, via the first memory data signal interface, to read test data stored at the first memory device;
 receive the test data from the first memory device across the first memory data signal interface;
 determine the phase difference between the DQS signal of the first memory device and the clock signal based on a timing of the received test data; and
 set a delay within the first memory data signal interface corresponding to the first memory device.

8. The interface circuit of claim 7, wherein
the plurality of memory data signal interfaces further comprises a second memory data signal interface,
the system control signal interface is further configured to receive a second read command from the memory controller, and
the emulation and command translation logic is further configured to:
select the second memory data signal interface based on the second read command;
receive a second data burst from the second memory data signal interface, wherein a timing reference for the second data burst is provided by a DQS signal of a memory device coupled to the second memory data signal interface;
delay the second data burst to align a phase difference between the clock signal and the DQS signal of the memory device coupled to the second memory data signal interface;

combine the delayed first data burst and the delayed second data burst into a contiguous data burst; and transmit the contiguous data burst to the memory controller.

9. The interface circuit of claim 8, wherein the emulation and command translation logic is further configured to:

emulate a virtual memory device using at least the memory device coupled to the first memory data signal interface and the memory device coupled to the second memory data signal interface, wherein a memory capacity of the virtual memory device is equal to a combined memory capacity of the two memory devices; and present the virtual memory device to the memory controller.

10. The interface circuit of claim 7, wherein selecting the first memory data signal interface further comprises receiving a calibration request and selecting the first memory data signal interface in response to the received calibration request.

11. The interface circuit of claim 7 further comprising data path logic, the data path logic configured to concatenate two or more data bursts to eliminate an inter-device command scheduling constraint between the two or more data bursts.

12. The interface circuit of claim 11, wherein the inter-device command scheduling constraint includes a rank-to-rank data bus turnaround time or an on-die-termination (ODT) control switching time.

13. A computer-implemented method, comprising:

selecting, by an interface circuit, a first memory data signal interface of a plurality of memory data signal interfaces;

issuing, by the interface circuit, a calibration read command, via the first memory data signal interface, to read test data stored at a memory device coupled to the first memory data signal interface;

receiving, by the interface circuit, the test data across the first memory data signal interface;

determining, by the interface circuit, a phase difference between a first DQS signal and a clock signal based on a timing of the received test data;

setting, by the interface circuit, a delay within the first memory data signal interface corresponding to the memory device coupled to the first memory data signal interface;

receiving, by an interface circuit, a first read command from a memory controller;

selecting, by the interface circuit, the first memory data signal interface of the plurality of memory data signal interfaces based on the first read command;

receiving, by the interface circuit, a second read command from a memory controller;

selecting, by the interface circuit, a second memory data signal interface of the plurality of memory data signal interfaces based on the second read command;

receiving, by the interface circuit, a first data burst from the first memory data signal interface, wherein a timing reference for the first data burst is provided by the first DQS signal of the memory device coupled to the first memory data signal interface;

receiving, by the interface circuit, a second data burst from the second memory data signal interface, wherein a timing reference for the second data burst is provided by a second, different, DQS signal of a memory device coupled to the second memory data signal interface;

delaying, by the interface circuit, the first data burst to align the phase difference between the first DQS signal and the clock signal of the interface circuit;

delaying, by the interface circuit, the second data burst to align a phase difference between the second DQS signal and the clock signal of the interface circuit;

concatenating, by the interface circuit, the delayed first data burst and the delayed second data burst into a contiguous data burst; and transmitting, by the interface circuit, the contiguous data burst to the memory controller.

14. The method of claim 13, further comprising:

emulating a virtual memory device using at least the memory device coupled to the first memory data signal interface and the memory device coupled to the second memory data signal interface, wherein a memory capacity of the virtual memory device is equal to a combined memory capacity of the first memory device and the second memory device; and presenting the virtual memory device to the memory controller.

15. The method of claim 13, wherein concatenating the delayed first data burst and the delayed second data burst into a contiguous data burst further comprises concatenating the delayed first data burst and the delayed second data burst into the contiguous data burst to eliminate an inter-device command scheduling constraint between the first data burst and the second data burst.

16. The method of claim 15, wherein the inter-device command scheduling constraint includes a rank-to-rank data bus turnaround time or an on-die-termination (ODT) control switching time.

* * * * *